(12) United States Patent
Rashev et al.

(10) Patent No.: US 7,558,332 B2
(45) Date of Patent: Jul. 7, 2009

(54) ADAPTIVE CONTROLLER FOR LINEARIZATION OF TRANSMITTER WITH IMPAIRMENTS

(75) Inventors: Peter Zahariev Rashev, Calgary (CA); David M. Tholl, Calgary (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 11/956,252

(22) Filed: Dec. 13, 2007

(65) Prior Publication Data

US 2008/0095266 A1 Apr. 24, 2008

Related U.S. Application Data

(62) Division of application No. 10/321,045, filed on Dec. 16, 2002, now Pat. No. 7,333,557.

(51) Int. Cl.
  H04K 1/02 (2006.01)
  H04L 25/03 (2006.01)
  H04L 25/49 (2006.01)
(52) U.S. Cl. .................................. 375/296; 330/278
(58) Field of Classification Search ................. 375/298; 330/278
  See application file for complete search history.

(56) References Cited

U.S. PATENT DOCUMENTS

| 4,577,334 | A | 3/1986 | Boer et al. |
|---|---|---|---|
| 4,717,894 | A | 1/1988 | Edwards et al. |
| 5,049,832 | A | 9/1991 | Cavers |
| 5,113,414 | A | 5/1992 | Karam et al. |
| 5,119,399 | A | 6/1992 | Santos et al. |
| 5,371,481 | A | 12/1994 | Tiittanen et al. |
| 5,524,285 | A | 6/1996 | Wray et al. |
| 5,613,226 | A | 3/1997 | Kanami |
| 5,732,333 | A | 3/1998 | Cox et al. |
| 5,740,520 | A | 4/1998 | Cyze et al. |
| 5,786,728 | A | 7/1998 | Alinikula |
| 5,815,532 | A * | 9/1998 | Bhattacharya et al. ...... 375/301 |
| 5,990,738 | A * | 11/1999 | Wright et al. ............... 330/149 |
| 6,133,789 | A | 10/2000 | Braithwaite |

(Continued)

OTHER PUBLICATIONS

Lohtia, A., et al., "Power Amplifier Linearization Using Cubic Spline Interpolation", *IEEE Vehicular Technology Conference*, (May 18-20, 1993), 676-679.

(Continued)

*Primary Examiner*—Curtis B Odom
(74) *Attorney, Agent, or Firm*—Schwegman, Lundberg & Woessner, P.A.

(57) ABSTRACT

An adaptive controller for linearization of transmitters using predistortion of the input signal has reduced sensitivity to impairments such as gain variation, phase noise or modulation/demodulation frequency instability by linearizing an adaptively normalized gain provided through a separate estimation and cancellation of linear gain variations. Values of a nonlinear and a linear gain blocks, cascaded with the linearized transmitter and called respectively a predistortion block and a gain regulation block, are independently adjusted by two different adaptive controllers. In one embodiment, four banks of real gain elements compose the predistortion block and realize an arbitrary step-wise approximation of a generalized 2×2 transmit gain matrix of nonlinear functions. In a further embodiment cancellation of a DC level bias multichannel impairment is provided by an adaptively adjusted signal adder inserted in the transmit chain between the predistortion block and the linearized transmitter.

23 Claims, 9 Drawing Sheets

U.S. PATENT DOCUMENTS

| | | | |
|---|---|---|---|
| 6,147,553 | A | 11/2000 | Kolanek |
| 6,169,463 | B1 | 1/2001 | Mohindra et al. |
| 6,194,964 | B1 | 2/2001 | Jun |
| 6,208,698 | B1 | 3/2001 | Marchesani et al. |
| 6,266,517 | B1 | 7/2001 | Fitzpatrick et al. |
| 6,275,685 | B1 | 8/2001 | Wessel et al. |
| 6,298,096 | B1 | 10/2001 | Burgin |
| 7,085,330 | B1 | 8/2006 | Shirali |
| 7,251,290 | B2 | 7/2007 | Rashev et al. |
| 2001/0022532 | A1 | 9/2001 | Dolman |
| 2002/0040250 | A1* | 4/2002 | Gaikwad et al. ............. 700/37 |
| 2002/0181611 | A1 | 12/2002 | Kim |
| 2003/0146791 | A1 | 8/2003 | Shvarts et al. |

OTHER PUBLICATIONS

Sano, A., et al., "Identification of Hammerstein-Wiener System with Application to Compensation for Nonlinear Distortion", *SICE 2002; Proceedings of the 41st SICE Annual Conference*; vol. 3, (Aug. 5-7, 2002), 1521-1526.

U.S. Appl. No. 10/321,045 Notice of Allowance mailed Sep. 21, 2007, NOAR,7 pgs.

U.S. Appl. No. 10/321,011, First Office Action mailed Apr. 5, 2006, OARN,21 pages.

U.S. Appl. No. 10/321,011, Final Office Action mailed Nov. 14, 2006, 19 pages.

U.S. Appl. No. 10/321,011, Notice of Allowance mailed Mar. 29, 2007, 4 pages.

U.S. Appl. No. 10/321,011, Response filed Jan. 16, 2007 to Final Office Action dated Nov. 14, 2006, 11 pages.

U.S. Appl. No. 10/321,011, Response filed Sep. 25, 2006 to First Office Action mailed Apr. 5, 2006, 12 pages.

U.S. Appl. No. 10/321,045, Response filed Aug. 31, 2007 to Non-Final Office Action dated Jun. 1, 2007, 9 pages.

Non-final office action mailed Jun. 1, 2007 in U.S. Appl. No. 10/321,045, 14 pgs.

Non-final office action mailed Nov. 29, 2006 in U.S. Appl. No. 10/321,045, 14 pgs.

Response filed Feb. 28, 2007 to non-final office action mailed Nov. 29, 2006 in U.S. Appl. No. 10/321,045, 16 pgs.

Faulkner, M., et al., "Amplifier Linearisation Using RF Feedback and Feedforward Techniques", *Proceedings of the IEEE Vehicular Technology Conference*, Chicago, IL,(Jul. 25, 1995),525-529.

Jones, A. E., et al., "Phase error correcting vector modulator for personal communications network(PCN) transceivers", *Electronics Letters*, 27(14), (Jul. 4, 1991), 1230-1231.

\* cited by examiner

ADAPTIVE CONTROLLER FOR LINEARIZATION OF TRANSMITTER WITH IMPAIRMENTS

INCORPORATION BY REFERENCE

This application is a divisional of U.S. patent application Ser. No. 10/321,045 filed Dec. 16, 2002, now U.S. Pat. No. 7,333,557 which is hereby incorporated by reference and made a part hereof.

This application is also related to U.S. patent application Ser. No. 10/321,011 filed Dec. 16, 2002 (now U.S. Pat. No. 7,251,290), which is hereby incorporated by reference.

FIELD OF THE INVENTION

The present invention relates to transmitters, and in particular to an adaptive linearization controller for a transmitter.

BACKGROUND OF THE INVENTION

Some signal transmitters for cellular communications utilize QAM (quadrature amplitude modulation) to increase the number of signals that can be transmitted on a given channel. QAM is a method of combining two amplitude-modulated (AM) signals into a single channel to effectively double the effective bandwidth. QAM is used with pulse amplitude modulation (PAM) in digital systems, especially in wireless applications.

In a QAM (quadrature amplitude modulation) signal, there are two carriers, each having the same frequency but differing in phase by 90 degrees (one quarter of a cycle, from which the term quadrature arises). The two modulated carriers are combined at the source for transmission. At the destination, the carriers are separated, the data is extracted from each, and then the data is combined into the original modulating information.

Radio transmitters amplify input signals. It is desired that the gain of such transmitters be linear for the entire range of input signals. Contemporary baseband techniques for linearization of radio transmitters, and in particular of power amplifiers, rely on frequent estimation of the nonlinear transmitter gain in terms of a single-argument complex gain function of the input signal, which after inversion is used for its pre-amplification or predistortion. The cascade of the nonlinear transmitter with the predistortion gain has the properties of a linearized system with residual distortions depending on the accuracy of initial gain estimation. Change of the average transmitter gain over time, which can be caused by different ambient factors, may significantly reduce the accuracy of gain estimation especially in cases when the predistortion process has different settling time constants over dynamic range. Therefore, the bandwidth of the adaptation process is increased from zero to a sufficient minimum providing reasonable convergence and tracking speeds for the fastest gain changes as well as suppression of white noise. A problem arises when in addition to the systematic gain changes there are system impairments in the same bandwidth causing random variations of the signal magnitude or phase, where the latter could be the result of phase noise or modulation/demodulation frequency instability.

Some of the major disadvantages of current systems are dependency on test signals or specific signaling formats for identification of such system impairments, as well as the complexity of the solutions requiring powerful offline processing capabilities. In one example signal transmission is attempted with minimal distortions such as bias, lock and quadrature angle errors by means of adaptive signal predistortion prior to transmission. Linearization of the transmitter is achieved by a separate predistortion block called 'predistorter with memory' which affects the transmitted signal before the previously mentioned adaptive predistortion. Although exploiting the idea of two separate predistortion blocks—one for compensation of transmitter nonlinearity and another for the rest of the system impairments (most of which are of linear nature), the solution lacks generality due to the use of designated test sequences for nonlinearity estimation and constellation models for impairment identification. Moreover, the level of complexity of the suggested identification and compensation procedures poses serious questions about the efficiency of its implementation.

Another technique attempts to estimate amplifier nonlinearity with limited sensitivity to IF noise and phase noise. Invariance with respect to system impairments is achieved by functional modeling of amplifiers utilizing spline approximation of noisy measurement data. A major drawback of the proposed system is that the measurements are conducted by stimulating the amplifier with designated reference bi-tone signals. In addition, there is a fair amount of computational complexity involved in the approximation process.

Yet another approach is based on a technique of inverse adaptive control, which includes a two-step process of linearization and impairment compensation. First, a forward polynomial model of the amplifier is created applying adaptive system identification techniques. Second, the forward model is used to generate noiseless signals applied as reference inputs to an inverse polynomial model of the amplifier. The parameters of a look-up-table based predistortion gain block implementing the real-time linearization are derived after format conversion from the inverse amplifier model. By its nature, this method is similar to the spline approximation technique. Implementation of polynomial nonlinearity estimation involves computationally expensive operations like raising signal samples to a power larger than 2 as well as a multi-step derivation of the corresponding inverse polynomials performing the predistortion.

Extensive analysis of multi-channel impairments in radio transmitters (i.e. impairments related to the way more than one input signals of the transmitter are combined into a single one prior to transmission) employing QAM has been performed along with the research of direct conversion techniques and predistorters for linearization of memoryless RF power amplifiers. As a result, symmetric and non-symmetric matrix models of gain and phase imbalance as well as DC level bias originating in the quadrature modulator sections of these transmitters have been developed.

Accordingly, optimal methods for compensation of quadrature modulator error factors in the transmitted waveforms have been designed using inverse models of the impairment matrices to predistort the transmitted signals prior to quadrature modulation. From application perspective, two types of compensation techniques have been demonstrated: (1) ones using special calibration sequences that are executed before a transmission session, and (2) ones providing continuous optimization of the compensation parameters during normal transmission.

Notwithstanding their complexity, performance or efficiency, the existing solutions demonstrate the common disadvantage of being restricted to particular devices in the transmitter chain, such as quadrature modulator sections, that cause a particular type of gain imbalance, crosstalk or DC level bias. In addition to the major assumption for memoryless transmitter nonlinearity and multi-channel impairments, hypotheses are made about the (1) linearity, (2) symmetry, and (3) location of the impairments. Interestingly, although being intended to operate in systems for predistortion linearization of RF power amplifiers the matrix inversion algorithms have been designed to utilize independent processing and correction elements from the ones implementing the linearization.

A number of existing solutions to the problem of multi-channel impairment compensation in signal transmitters are aimed at improving the overall quality of transmission by perfecting the worst performing functional blocks in the transmitter chain. For example, these are the quadrature modulator stages in radio transmitters employing quadrature amplitude modulation. The proposed systems can be separated in two corresponding groups depending on whether the performance of the targeted functional block is calibrated before or continuously improved during normal transmitter operation.

Calibration algorithms for minimization of quadrature modulator errors such as gain/phase imbalance and carrier leakage causing DC level bias involve determination of predistortion parameters for a quadrature modulator, quadrature measurement and calibration of a vector modulator, and calibration of vector modulators using a scalar detectors. A technique for adjusting the balance and the 90-deg phase difference of the outputs of a quadrature modulator has also been used. A system architecture allowing continuous optimization of gain and phase imbalance during transmission involves a quadrature modulator imbalance estimator and modulator stage using it. A technique for adaptive compensation of carrier leakage in a quadrature modulator involves a quadrature modulator with set-and-forget carrier leakage compensation.

A common disadvantage of the above-cited solutions is the lack of generality in the treatment of transmit channel impairments, which are often limited to a single functional block of the transmitter chain and assumed to be linear in nature. In addition, the cause of channel crosstalk is attributed only to loss of orthogonality between the quadrature phases and is represented by antipodal terms that are equal in magnitude and opposite in sign (i.e. demonstrating a certain level of symmetry). The suggested calibration or adaptive procedures are explicitly designed to improve the performance of two-channel transmitters and, thus, their upgrade for multi-channel transmitters is not straightforward. Moreover, application of these techniques in a system for transmitter linearization would require a significant amount of extra computational or hardware resources to be dedicated for channel imbalance compensation because of the high degree of incompatibility between the existing hardware-efficient linearization algorithms and the quadrature modulator algorithms.

SUMMARY OF THE INVENTION

A controller for adaptive baseband linearization of radio transmitters has reduced sensitivity to system impairments in the transmitter chain such as gain variation, phase noise or modulation/demodulation frequency instability. The controller provides separate estimation and cancellation of linear gain variations in order to achieve minimal susceptibility to these system impairments. Values of a linear and a nonlinear digital complex gain blocks, called respectively a gain regulation block and a predistortion block, are independently adjusted. The gain blocks are cascaded with the linearized transmitter and are managed by two different adaptive controllers. The gain regulation block approximates the linear gain of the closed-loop adaptive linearization system or its inverse, while the predistortion block approximates the inverse of the normalized nonlinear transmitter gain (of unity average magnitude and zero average phase).

Stability of operation is maintained unconditionally since each of the two adaptive controllers (for closed-loop gain regulation and for predistortion) operates independently within a designated time-slot and is responsible for a different section of the adaptive linearization loop.

Cancellation of lower-frequency system impairments affecting the magnitude and phase stability of the adaptive feedback signals is achieved using faster estimation of the average closed-loop system gain to provide gain- and phase-normalized feedback signals for estimation of the transmitter nonlinearity. Normalization of the adaptive feedback signals is achieved for the average signal values while the instantaneous ones can be subjected to random linear magnitude and phase variations. The lowest frequency of the variations is equal to the frequency of closed-loop gain estimation performed by the gain regulation controller, termed here 'chopping frequency', which is normally set to be more than 2 decades larger than the cut-off frequency of the predistortion controller. Reduction of the complexity of the predistortion controller is achieved by using phase normalized feedback signals to help minimize the overall increase of system complexity due to the gain regulation controller.

In a further embodiment means are provided for reduced sensitivity to multi-channel transmitter impairments such as gain imbalance, phase imbalance and DC level bias as well as to transmitter nonlinearity. Four banks of real gain elements are inserted before a baseband input of a nonlinear transmitter to realize an arbitrary step-wise approximation of a generalized 2×2 transmit gain matrix of nonlinear functions. For each sample of the input signal a corresponding matrix of four gain elements is selected to form a predistorted signal with inand quadrature-phase components, which are independently created as linear combinations of the input in-phase and quadrature signal components.

A law of selecting the gain elements from the predistortion banks may not be unique, meaning that the same gain element can be predistorting input signal samples of different value. The DC level of the predistorted signal is shifted in a DC offset compensation block located before the transmitter input.

The adaptive loop is closed between the inputs of the predistortion gain banks and the output of the transmitter at an adaptive controller that is the subject of this disclosure. The forward branch of the loop is connected directly to the system input. The feedback branch of the loop is connected to the transmitter output through a linear receiver so that a baseband version of the output RF transmitted signal is provided to the adaptive controller.

The architecture of the linear receiver is selected to minimize introduction of unknown channel imbalance and crosstalk errors or DC level bias to the feedback branch of the adaptive loop so that effective channel impairment and DC level bias compensation are provided at the transmitter output. The adaptive controller is composed of four banks of real-number linear adaptive controllers, which continuously adjust the values of their corresponding gain elements from the predistortion banks as well as of a complex-number linear adaptive controller for the update of the two DC offset compensation values. An initial condition for convergence of the adaptive controller is that the phase shift of the input signal measured at the feedback input of the adaptive controller be bounded between −45 and 45 deg over full dynamic range at start-up.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
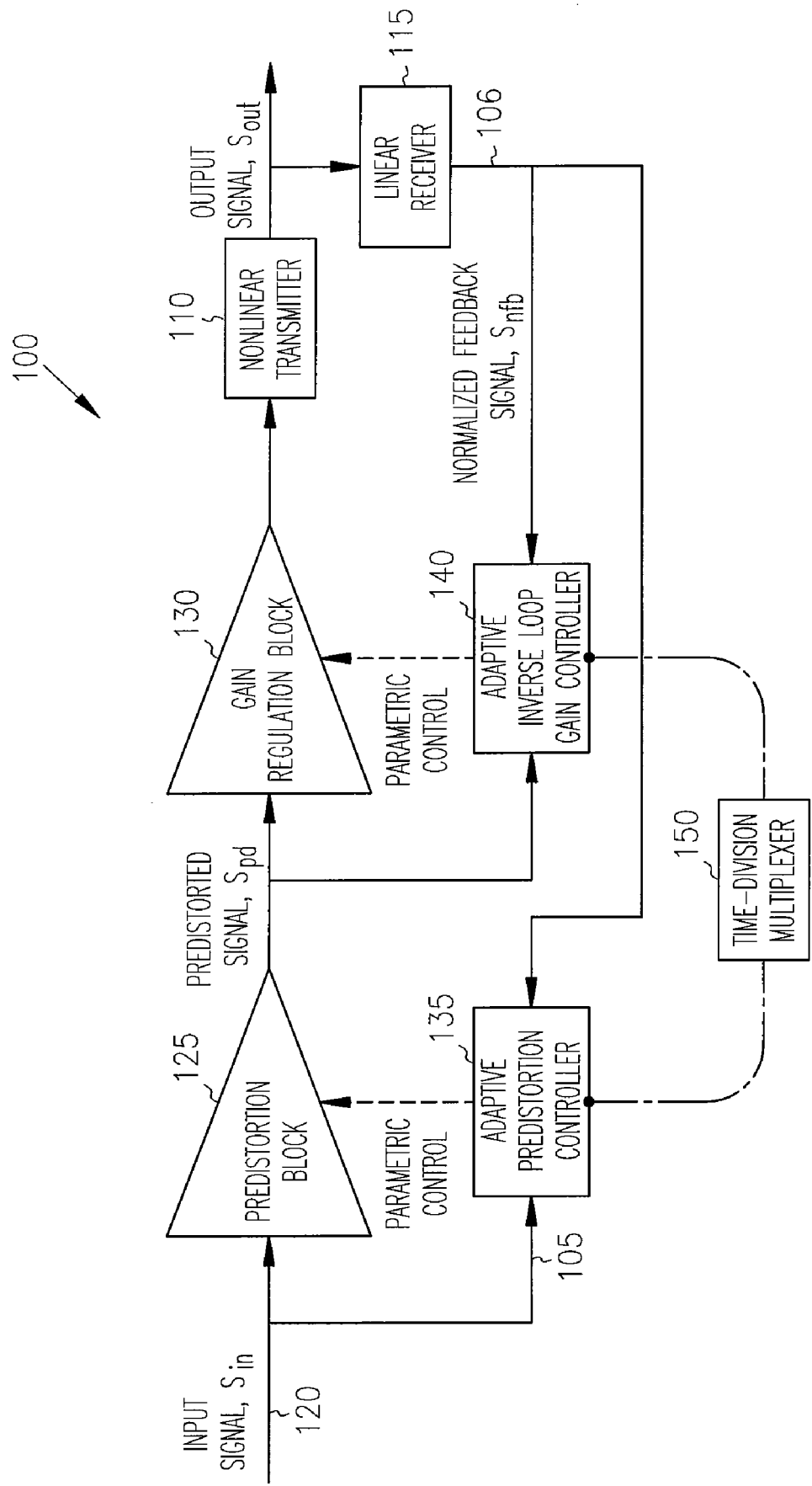
FIG. 1 is a block diagram of a transmitter linearization loop having gain regulation in a transmitter section.

Adaptive Linearization Controller with Reduced Sensitivity to System Impairments: Gain, Phase or Frequency Variation An adaptive transmitter linearization loop 100 in FIG. 1 provides effective cancellation of gain, phase or frequency variations in adaptive loops for transmitter linearization, which are composed of two branches: a forward 105 and a feedback branch 106 propagating respectively the input and the output signals of the transmitter 110. The feedback branch 106 includes a linear receiver 115 responsible for down-converting the transmitted signal to the format of an input signal 120. Prior to transmission, the input signal is subjected to nonlinear complex-number amplification in a predistortion functional block 125. Compensation of the linear variations in the adaptive loop is achieved using a complex gain regulation functional block 130 that performs additional scaling of the signal in the feedback branch 106 of the adaptive loop. The predistortion block 125 is controlled by an adaptive predistortion controller 135, which is responsible for the estimation of the nonlinearity present in the adaptive loop. The gain regulation block 130 is controlled by an adaptive gain controller 140 responsible for the estimation of the inverse linear gain of a section of the adaptive loop located between the output of the gain regulation block 130 and the feedback branch 106. The gain of the gain regulation block 130 is controlled in such way that the linear gain of the cascaded gain regulation block, nonlinear transmitter and linear receiver is unity. As a result, the short-term average levels of the signals at the inputs of the predistortion controller 135 (measured over a period that is much shorter than the fastest settling time of the predistortion process) are equal. Thus, the transmitter nonlinearity as well as its corresponding predistortion function and respectively predistortion gain are estimated with unity mean magnitude and zero mean phase. The two controllers are allowed to operate in non-overlapping time-slots that are designated to them by a time-division multiplexer 150.

Figure 3:
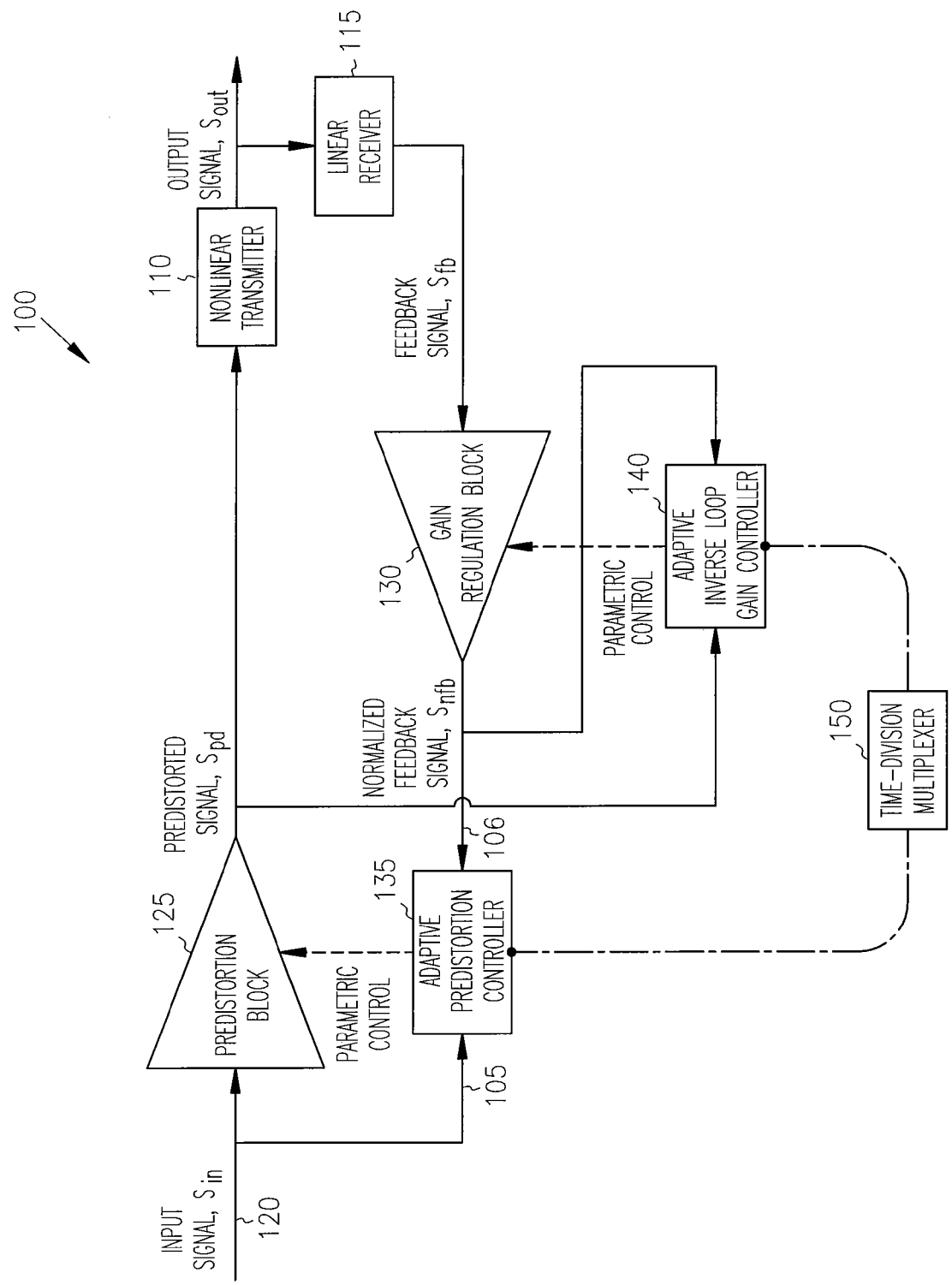
FIG. 3 is a block diagram of transmitter linearization loop having gain regulation in a feedback branch of a linearization loop.
Figure 5:
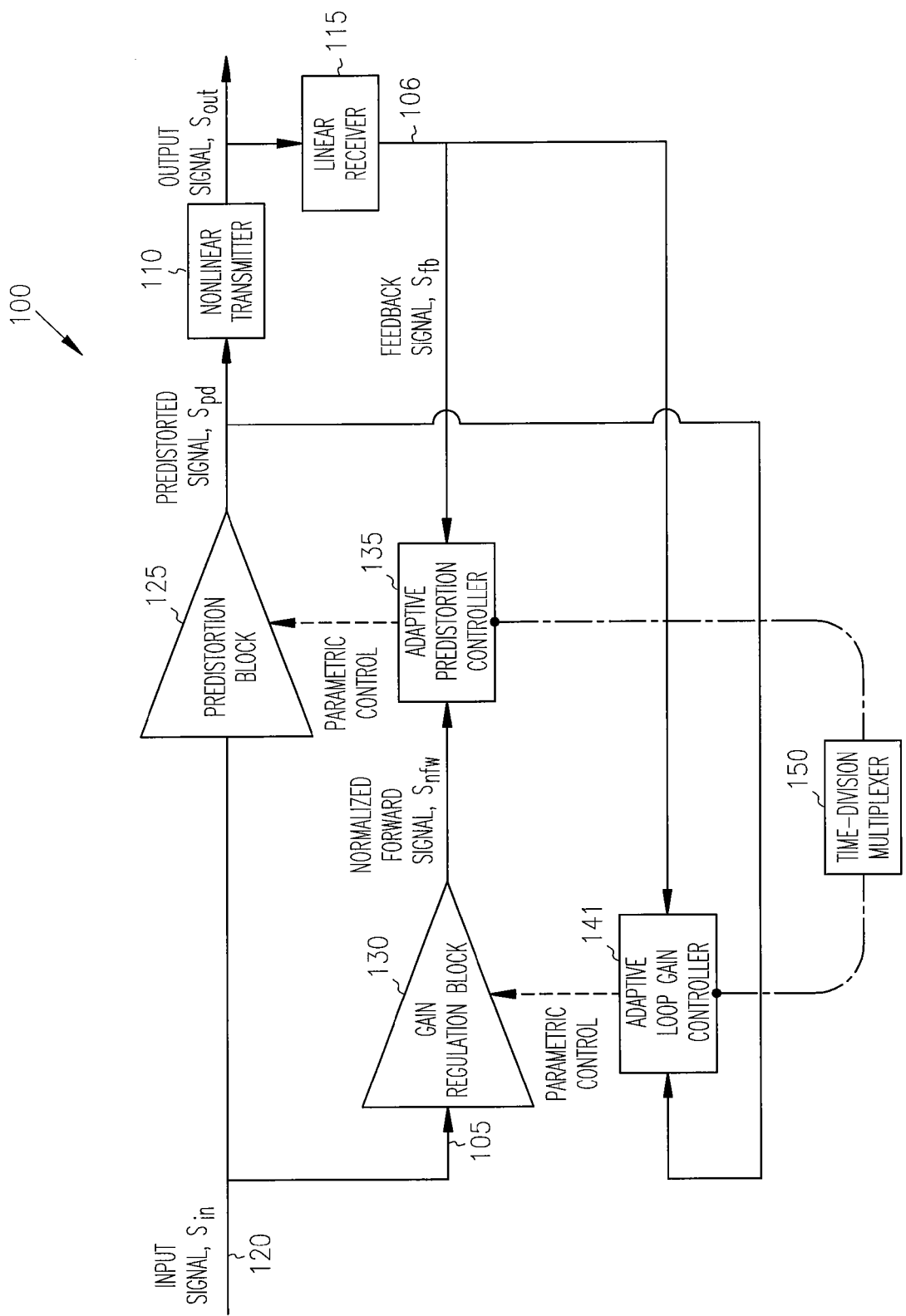
FIG. 5 is a block diagram of a transmitter linearization loop having gain regulation in a forward branch of the linearization loop.

Alternatives for reducing linearizer susceptibility to gain, phase or frequency instability are illustrated by three system architectures presented on FIGS. 1, 3 and 5. They all employ the same principle of operation and the same types of functional blocks but use different positions of the complex gain regulation element providing impairment compensation. Any of the three architectures is composed of the following functional blocks:

(a) adaptive loop 100 encompassing the nonlinear transmitter via two branches: a forward branch 105 that propagates the input signal $s_{in}$ at 120 and a feedback branch 106 that propagates the output signal of the transmitter $s_{out}$;

(b) linear receiver 115 responsible for down-converting the transmitted signal to the format of the input signal in the feedback branch of the adaptive loop;

(c) predistortion functional block 125 performing nonlinear complex-number amplification of the input signal prior to transmission;

(d) complex gain regulation functional block 130 performing appropriate scaling of the signal in the feedback branch of the adaptive loop, or of the predistorted signal before entering the transmitter or of the input signal propagating through the forward branch of the adaptive loop;

(e) adaptive predistortion controller 135, which is responsible for the estimation of the normalized nonlinearity of the adaptive loop caused by the transmitter as well as for the control of the predistortion block 125;

(f) time-division multiplexer 150 synchronizing time-slots designated for the predistortion process and the gain regulation process.

A major difference between FIGS. 1, 3 and FIG. 5 is in terms of the adaptive controller specifying the gain of the gain regulation block 130. The architectures from FIGS. 1 and 3 contain an adaptive gain controller 140, which is responsible for the estimation of the inverse linear gain of a portion of the adaptive loop 100 located between the output of the predistortion block 125 and the feedback branch 106 excluding the gain regulation block. The architecture from FIG. 5 includes an adaptive gain controller 141 estimating the linear gain of this portion.

Figure 2:
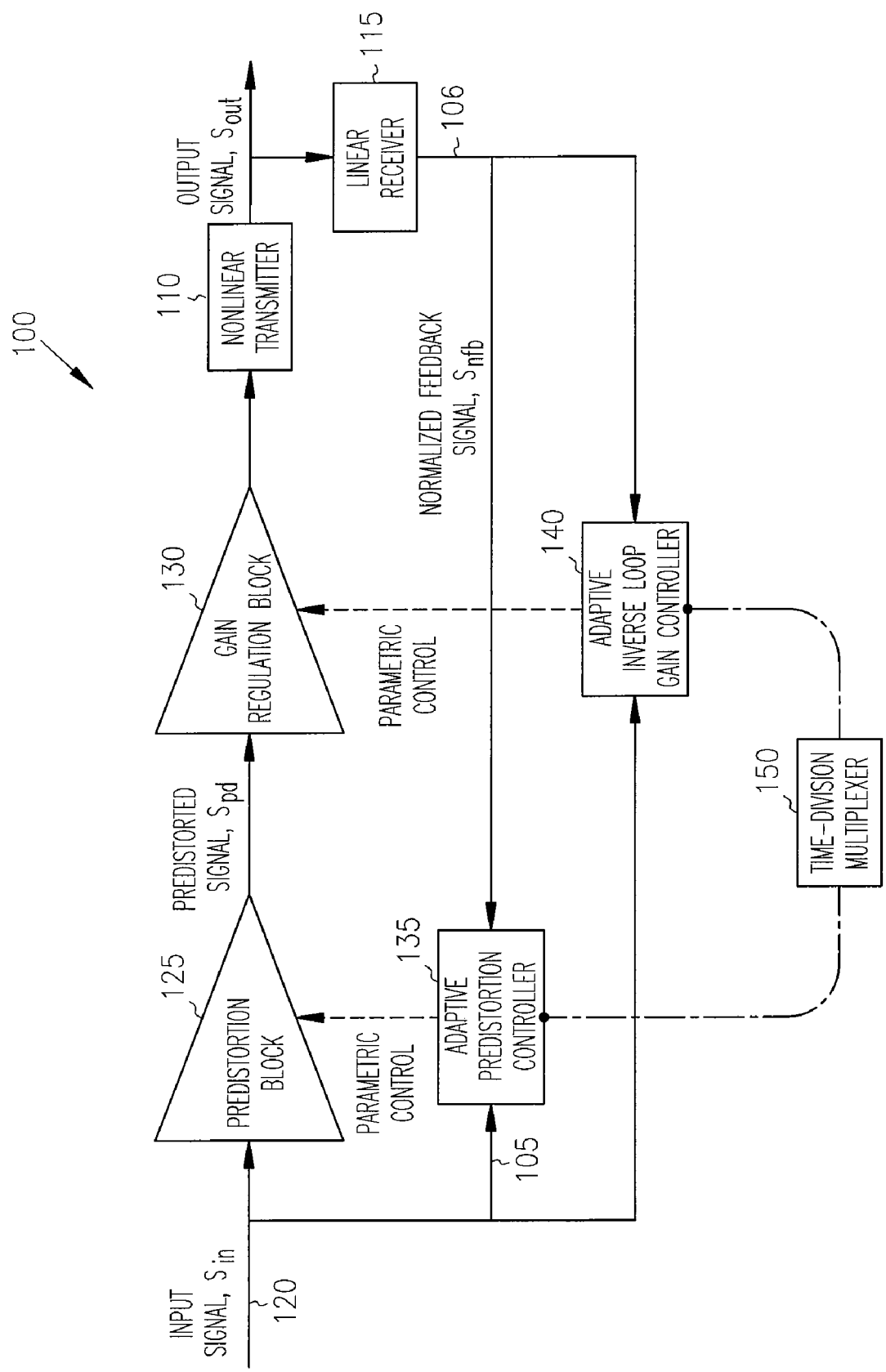
FIG. 2 is a block diagram of an alternative transmitter linearization loop having gain regulation in a transmitter section.
Figure 4:
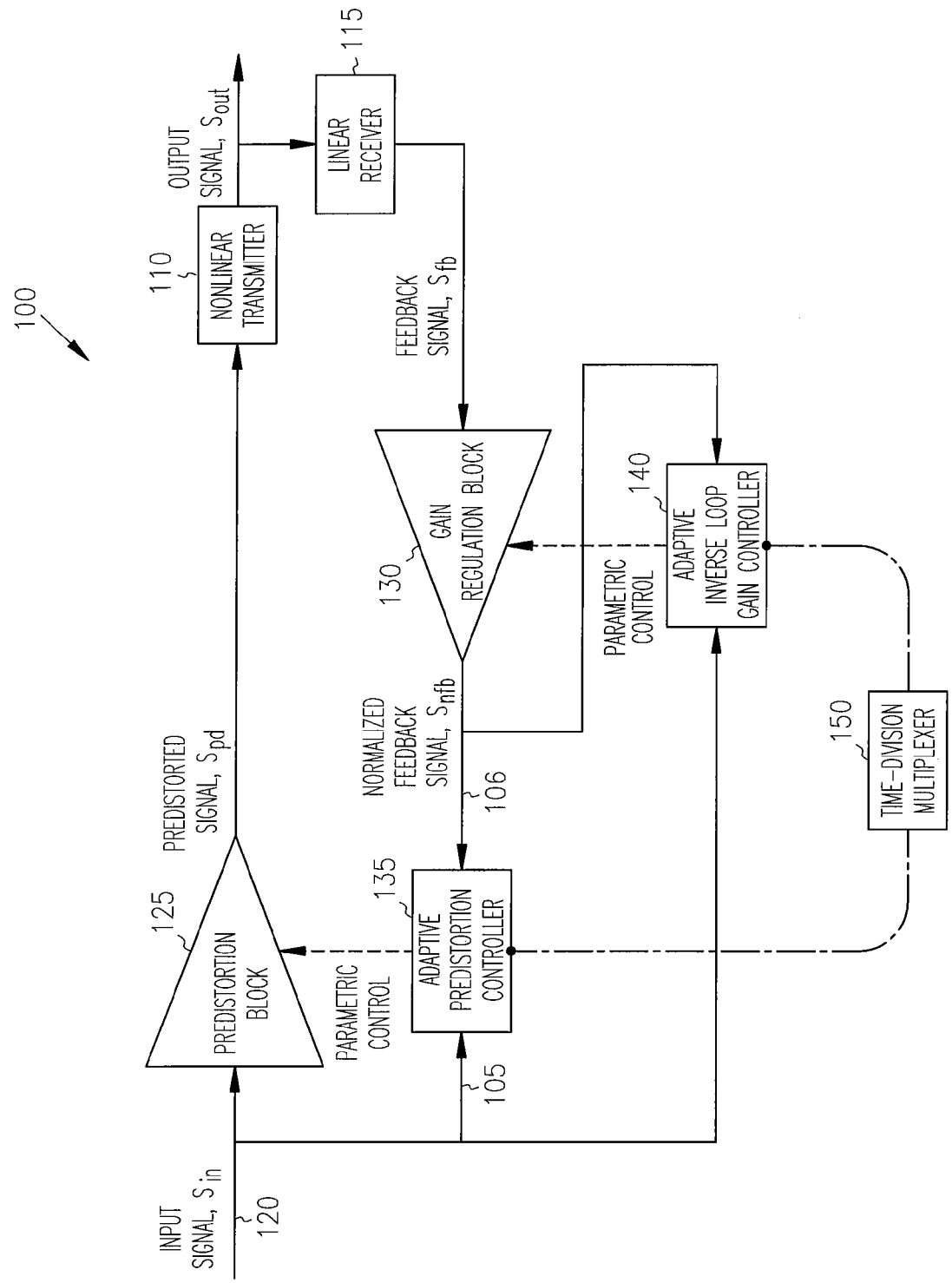
FIG. 4 is a block diagram of an alternative transmitter linearization loop having gain regulation in a feedback branch of a linearization loop.
Figure 6:
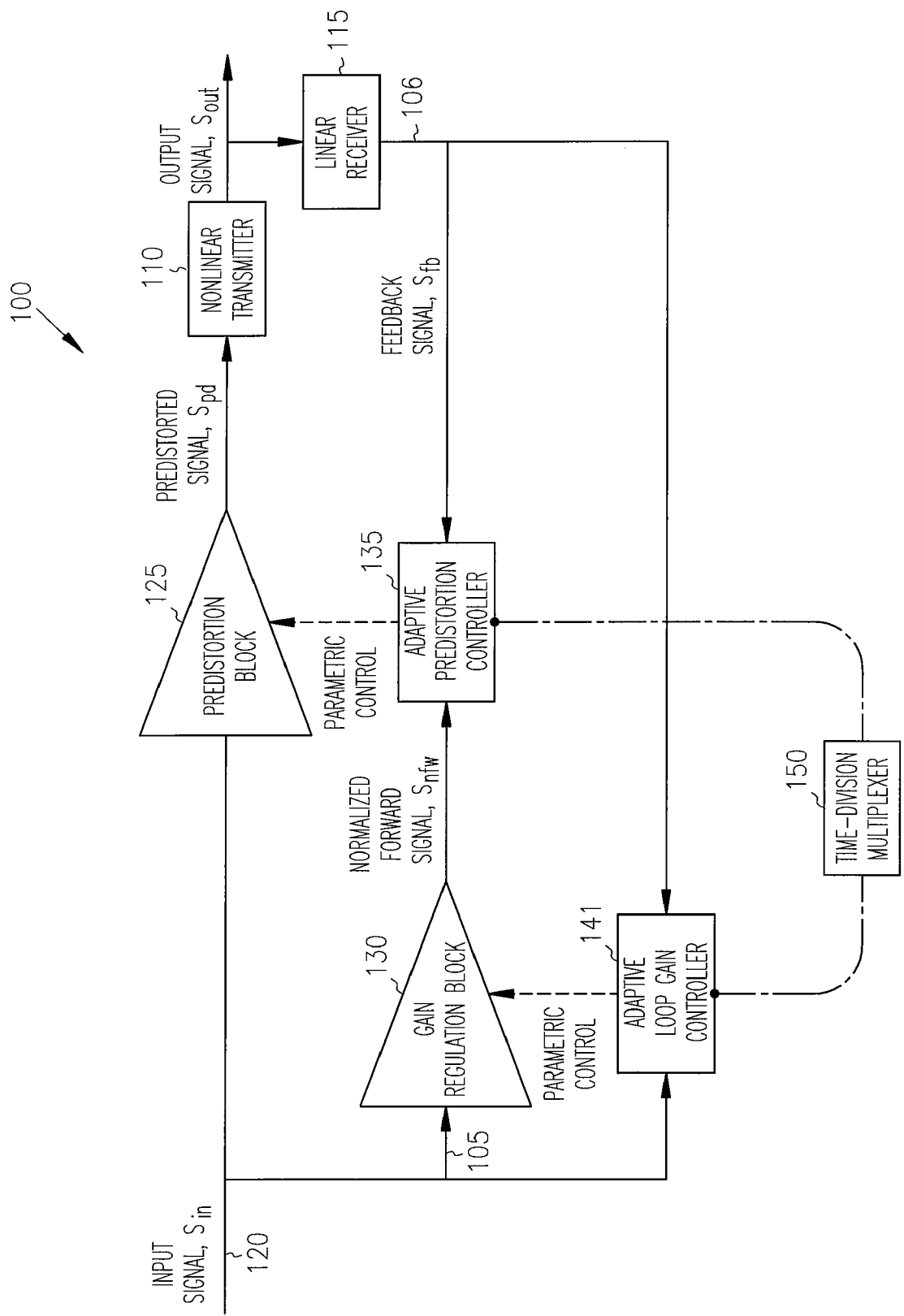
FIG. 6 is a block diagram of an alternative transmitter linearization loop having gain regulation in a forward branch of the linearization loop.

A new set of architectural options is illustrated in FIGS. 2, 4 and 6 that contain functional blocks, which are very similar to the ones from their respective counterparts FIGS. 1, 3 and 5. They demonstrate the same operational properties and can be constructed by attaching the inputs of the adaptive gain controllers 140 or 141 to the forward branch 105 and the feedback branch 106 of the adaptive loop 100. Then, the linear gain or the inverse linear gain of the entire adaptive loop including the predistortion block are subjected to estimation and normalization.

Various features of the abovementioned architectural options to build an adaptive linearization controller with reduced sensitivity to system impairments are summarized below.

FIG. 1 realizes cancellation of the linear system impairments using the gain regulation block 130 inserted between the predistortion block 125 and the nonlinear transmitter 110. The gain regulation block 130 is controlled by the adaptive inverse loop gain controller 140 in such way that its gain is equal to the inverse of the linear gain of the cascaded nonlinear transmitter 110 and linear receiver 115 blocks. The signal of the feedback branch 106 $s_{nfb}$ is subjected to unity average magnitude gain and zero mean phase offset caused by impairments in the transmitter 110 or receiver 115 sections of the system. Then, the adaptive predistortion controller 125 estimates a nonlinear gain of unity mean over dynamic range utilizing the input signal to the transmitter $s_{in}$ at 120 and a normalized version of its output signal $s_{nfb}$ at 106. The linear gain of the adaptive loop sectioned between the output of predistortion block 125 and the feedback branch 106 is maintained close to unity, i.e. the system that is 'seen' by the adaptive predistortion controller has an average gain of unity.

In FIG. 2, gain regulation is provided by inverse gain estimation of the full adaptive loop, including the predistortion block section 125. It has no functional differences with respect to the FIG. 1 given the unity mean gain of the predistortion block 125 and may require less processing complexity for signal synchronization in the adaptive controllers because both (135 and 140) of them utilize the same signal inputs.

In FIG. 3, gain regulation is provided at the feedback branch of the linearization loop 106. Impairment cancellation is implemented in a very similar way although having a different location of the gain regulation block 130, which in this case is positioned after the linear receiver. Again, the adaptive predistortion controller 135 estimates a nonlinear gain of unity mean over dynamic range utilizing the input signal to the transmitter $s_{in}$ at 120 and a normalized version of its output signal $s_{nfb}$ at 106. Normalization of the feedback signal $s_{nfb}$ is achieved through inverse modeling of the linear gain of the cascaded nonlinear transmitter and linear receiver sections. Similarly to the previous option from FIG. 1, the adaptive predistortion controller 135 'sees' a system of unity average gain that encompasses the section of the adaptive loop between the output of predistortion block 125 and the feedback branch 106.

In FIG. 4, inverse gain estimation of the full adaptive loop including the predistortion block 125 is provided similarly to FIG. 3. It has no functional differences with respect to the architecture form FIG. 3 given the unity mean gain of the predistortion block and may require less processing complexity for signal synchronization in the adaptive controllers because both of them (135 and 140) utilize the same signal inputs.

FIG. 5 provides gain regulation at the forward branch of the linearization loop 105. Linear impairments are cancelled indirectly by creating their replicas in the forward branch of the adaptive loop. Thus, the same impairment would appear at both inputs of the adaptive predistortion controller 135 and have a minimal effect on the predistortion process. The gain regulation block 130 is placed in front of the 'forward' input of the adaptive predistortion controller 135. The latter is responsible for the estimation of a nonlinear gain of unity mean over dynamic range utilizing a normalized version of the input signal to the transmitter $s_{nfw}$ at the output of the gain regulation block 130 and a feedback signal from its output $s_{fb}$ at 106. Here, the normalization of the input signal $s_{in}$ at 120 is achieved through classical adaptive modeling of the linear gain of the cascaded nonlinear transmitter 110 and linear receiver 115 blocks, where the normalization is it with respect to the short-term average level of the feedback signal at 106 (for a definition of 'short-term' see the explanation of FIG. 1 at the beginning of this subsection). Note, that the linear gain of the section of the adaptive loop between the output of predistortion block 125 and the feedback branch 106 is not necessarily maintained close to unity.

FIG. 6 has no functional differences with respect to FIG. 5 given that the predistortion block 125 has no impact on the average gain of the adaptive loop 100 as long as its gain is of unity mean over dynamic range. This system may feature smaller number of functional elements implementing signal synchronization in the adaptive controllers 135 and 141 because of signal reuse at their forward signal inputs and fixed delay difference between them.

In the architectural options from FIGS. 1-4, the signal at the feedback branch 106 of the adaptive loop 100 is normalized with respect to the input signal at 120. In the architectural options from FIGS. 5 and 6, the signal at the forward input of the adaptive predistortion controller 135 i is normalized with respect to the signal at the feedback branch 106. The frequency of multiplexing is chosen to be approximately at least 2-3 decades away from a cut-off frequency of the predistortion controller. The settling time of the gain controller is smaller than the duration of its designated time-slot in one embodiment.

Linear impairments such as gain, phase or frequency instability in the nonlinear transmitter 110 or the linear receiver 115 cause magnitude and phase variation in the adaptive feedback of a system for transmitter linearization. The process can be modeled by multiplying an ideal downconverted output signal of the nonlinear transmitter $s_{fb}^{id}$ with no incurred impairments by a random complex number $G_{imp}$:

$$s_{fb} = s_{fb}^{id} \cdot G_{imp}(t); \text{Mean}[|G_{imp}|] = \text{const1}, \text{Mean[angle}[G_{imp}]] = \text{const2 for } 0 \leq t \leq T_{SW} \qquad 1$$

where $s_{fb}$ is the real-system downconverted output signal of the nonlinear transmitter; and the impairment factor $G_{imp}$ has constant mean magnitude and phase over certain period of time $T_{sw}$ called switching period. The mean values of the impairment factor depend on the statistical distribution of the signal samples, on the shape and the type of transmitter nonlinearity and on the statistical averages of the impairments. In case that zero mean impairments affect the system blocks after the transmitter, const1=1 and const2=0.

The system architectures shown in FIGS. 1-6 employ the same principle of operation based on linear adaptive modeling of the cascade composed of the nonlinear transmitter 110 and the linear receiver 115 providing adaptive feedback:

$$G_L = \text{Mean}[G_{tx}] \cdot G_{rx} \cdot G_{imp}$$

where $G_L$ is the modeled system gain; $\text{Mean}[G_{tx}]$ is the average linear gain of the nonlinear transmitter that is a function of the statistical distribution of the input signal samples, the transmitter nonlinearity and composite gain of the linear functional blocks in the transmitter; and $G_{rx}$ is the gain of the linear receiver. The goal of the gain regulation block is to scale the signal at the feedback 106 or the forward 105 branches of the adaptive loop 100 respectively by the reciprocal (inverse) or the current value of $G_L$ so that any signal variations caused by average gain instability in the loop are not visible at the inputs of the adaptive predistortion controller. For architectural options in FIGS. 1-4, this is described by $$s_{nfb} = NL[s_{pd}] \cdot G_L \cdot G_L^{inv} \approx NL[s_{pd}]; err_{preD} = 0 \Leftrightarrow s_{in} = NL[s_{pd}] \qquad (2a)$$

and for architectural options in FIGS. 5 and 6, it is formalized by $$s_{nfw} = s_{pd} \cdot G_L; \qquad err_{preD} = 0 \Leftrightarrow s_{in} \cdot G_L = NL[s_{pd}] \cdot G_L \Leftrightarrow s_{in} = NL[s_{pd}] \qquad (2b)$$

where NL[ ] is a nonlinear function of the predistorted input signal $s_{pd}$ of unity mean over statistical dynamic range representing the transmitter nonlinearity; $s_{nfb}$ and $s_{nfw}$ are respectively the normalized (by the gain regulation block 130) feedback and input signals; $G_L^{inv}=1/G_L$ is the inverse of the linear system gain $G_L$; and $err_{preD}$ is the error signal driving the convergence of the predistortion process towards an optimum.

The founding assumption of the proposed method is that the linear system gain $G_L$ remains constant during the switching period $T_{sw}$. Then, the minimal frequency of re-estimation of $G_L$ that guarantees no additional loss of accuracy is $1/T_{sw}$. The time available to the adaptive gain controller (either the inverse loop gain one 140 from options in FIGS. 1-4, or the forward loop one 141 from the option in FIGS. 5-6) for update of the gain regulation block 130 is less than $T_{sw}$, while the remaining of the switching period is used by the adaptive predistortion controller 135. A practical value for loop gain estimation time, that would reduce the convergence/tracking speed of the predistortion process by a half, is $T_{sw}/2$.

The proposed systems demonstrate increased robustness due to two main reasons. First, the principle of separation of the two adaptive controllers by space, e.g. the two controllers (the predistortion one and the gain one) estimate different sections of the adaptive loop, and by time, e.g. the two controllers never work simultaneously, provides increased stability margins. It must be noted that this is completely true only for the systems from FIGS. 1, 3 and 5 since the 'full-loop' versions of these systems (see FIGS. 2, 4 and 6) do not feature separation by space. Instead, their gain controllers have the benefit of estimating linearized systems and, therefore, can provide more accurate gain regulation and respectively signal normalization. The errors of loop gain estimation are not critical to the predistortion process (as long as they are kept within reasonable limits) if the switching period $T_{sw}$ is at least 2 to 3 orders of magnitude smaller than the fastest settling time of the predistortion controller. Thus, there is sufficient separation between the frequency band of self-inflicted system noise and the predistortion bandwidth.

Adaptive Linearization Controller with Multi-Channel Impairment Compensation: Gain Imbalance, Phase Imbalance, or DC Level Bias Details regarding adaptive controller operation of one embodiment is described with reference to FIGS. 7 and 8. The adaptive controller is composed of four banks of real-number linear adaptive controllers, which continuously adjust the values of their corresponding gain elements from the predistortion banks as well as of a complex-number linear adaptive controller for the update of the two DC offset compensation values. The following advantages may be provided in different embodiments.

Simultaneous linearization and compensation of channel impairments leads to efficient system implementation. More accurate channel impairment compensation is provided by using general nonlinear models. Integration of the optimization processes for transmitter linearization and channel impairment compensation allow efficient implementation with a single nonlinear adaptive controller. Straightforward architectural upgrade for multi-channel transmitters is available by a trivial increase of the number of processing units while preserving the main properties of the predistortion methods described herein.

In further embodiments, no coordinate system or format transformations of the input signals are required for implementation of the control algorithms. No division operations involving the input, feedback or error signals are required, reducing computing complexity. The adaptive controller also reduces dependence on the statistics of the input signal, and no use of special calibration or tuning sequences before or during transmission is required.

The proposed controller architecture is applicable to the linearization and channel impairment compensation of radio transmitters employing quadrature amplitude modulation, which are predominantly frequency non-selective in a narrow bandwidth around the RF carrier that measures four to five times the double-sided baseband bandwidth of the transmitted signal.

The linearization method tolerates different classes of final power amplifier stages (for example. A, AB or B) if the output signal distortion caused by them is memoryless, i.e. it can be modeled with sufficient accuracy using an arbitrary function of the instantaneous input signal parameters.

The channel impairment compensation provides effective memoryless equalization of imbalanced signal amplification and cancellation of DC level bias incurred during digital-to-analog conversion or quadrature modulation as well as elimination of leakage between the quadrature signal channels.

Figure 7:
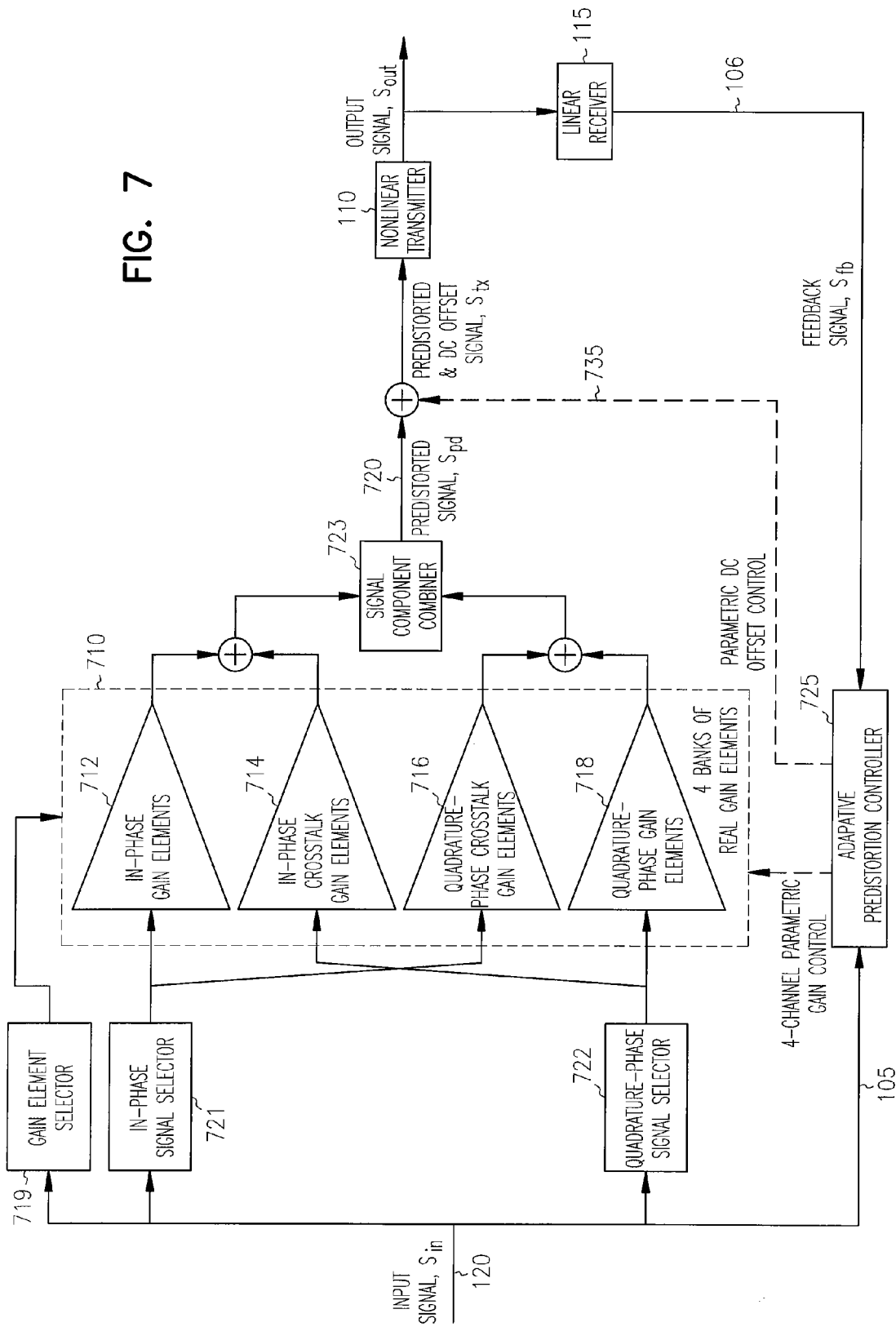
FIG. 7 is a block diagram of an adaptive control loop for a nonlinear transmitter.

A high-level block diagram of a baseband adaptive control system for transmitter linearization using the suggested controller architecture is presented in FIG. 7. In the case of linearization of a QAM radio transmitter, four banks 710 of real predistortion gain elements 712, 714, 716, and 718 are inserted before the baseband input 120 of the nonlinear transmitter 110 to realize an arbitrary step-wise approximation of a 2×2 transmit gain matrix modeling the generalized nonlinear transmitter gain. For each sample of the input signal $s_{in}$ at 120 a corresponding matrix of four predistortion gain elements is selected by gain element selector 719 to form a predistorted signal $s_{pd}$ at 720 with in-phase and quadrature components that are independently created as linear combinations of the input in- and quadrature-phase signal components as controlled by in-phase signal selector 721 and quadrature-phase selector 722. In-phase signal selector 721 is coupled to in-phase gain elements 712 and quadrature-phase crosstalk gain elements 716. Quadrature-phase signal selector 722 is coupled to in-phase crosstalk gain elements 714 and quadrature-phase gain elements 718. A signal component combiner 723 combines the added together outputs of the in-phase gain elements 712 and 714 with the added together outputs of the quadrature-phase gain elements 716 and 718 to form the predistorted signal $s_{pd}$ at its output 720.

The selection of the predistortion gain elements may not be unique with respect to the predistortion gain banks, meaning that the same gain element can be predistorting input signal samples of different value. This condition allows the predistortion gain banks 710 to be of finite size and, therefore, be implementable in hardware when approximating arbitrary predistortion functions of input signals having infinite number of states (e.g. as in the case of QAM transmitters). The transmitted signal $s_{tx}$ at the input of the nonlinear transmitter 110 is a DC-offset version of the predistorted signal $s_{pd}$ at 720 formed by adding DC level shifts to its in- and quadrature-phase signal components.

The adaptive loop is closed between the inputs of the gain banks and the output of the transmitter at an adaptive controller 725. The forward branch of the loop 105 is connected directly to the system input at 120 and accepts the input signal to the transmitter $s_{in}$. The feedback branch of the loop 106 is connected to the transmitter output through a linear receiver 115 so that a baseband version, $s_{fb}$, of the output RF transmitted signal $s_{out}$ is provided to the adaptive controller 725. In one embodiment, the phase shift of the input signal measured at the feedback input of the adaptive controller is bounded between −45 and 45 deg over full dynamic range at start-up.

The architecture of the linear receiver 115 in feedback is designed to minimize contribution of unknown channel imbalance and crosstalk errors or DC level bias to the feedback branch 106 of the adaptive loop in order to achieve effective channel impairment and DC offset compensation at the transmitter output.

The adaptive controller 725 contains four banks of real-number linear proportional-integral (PI) controllers, which continuously adjust the values of their corresponding gain elements from the predistortion banks as well as a complex-number linear PI controller updating the DC offset compensation value 735 which is combined with the predistorted signal $s_{pd}$ at 720.

Figure 8A:
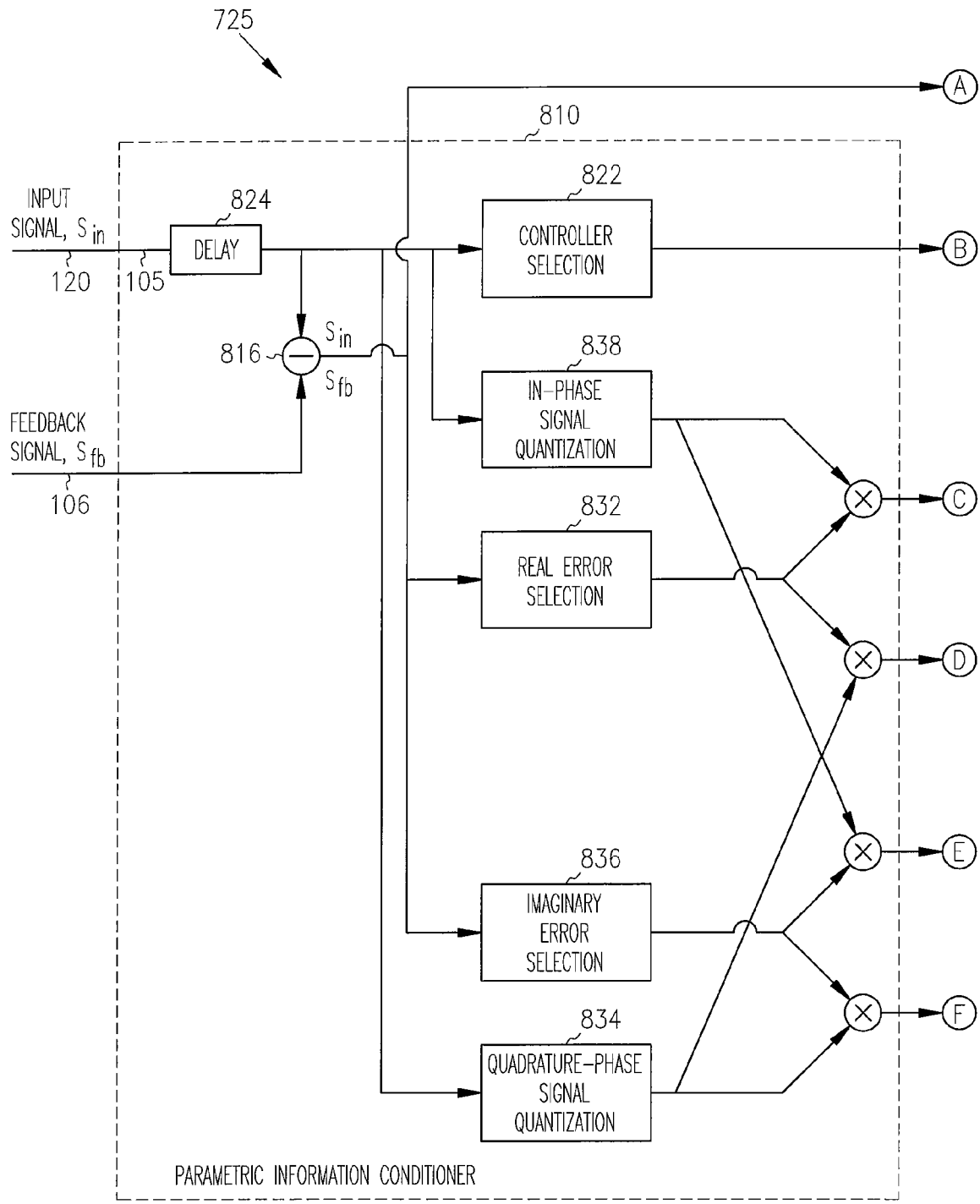
FIGS. 8A and 8B are a block diagram of an adaptive controller for a nonlinear transmitter.
Figure 8B:
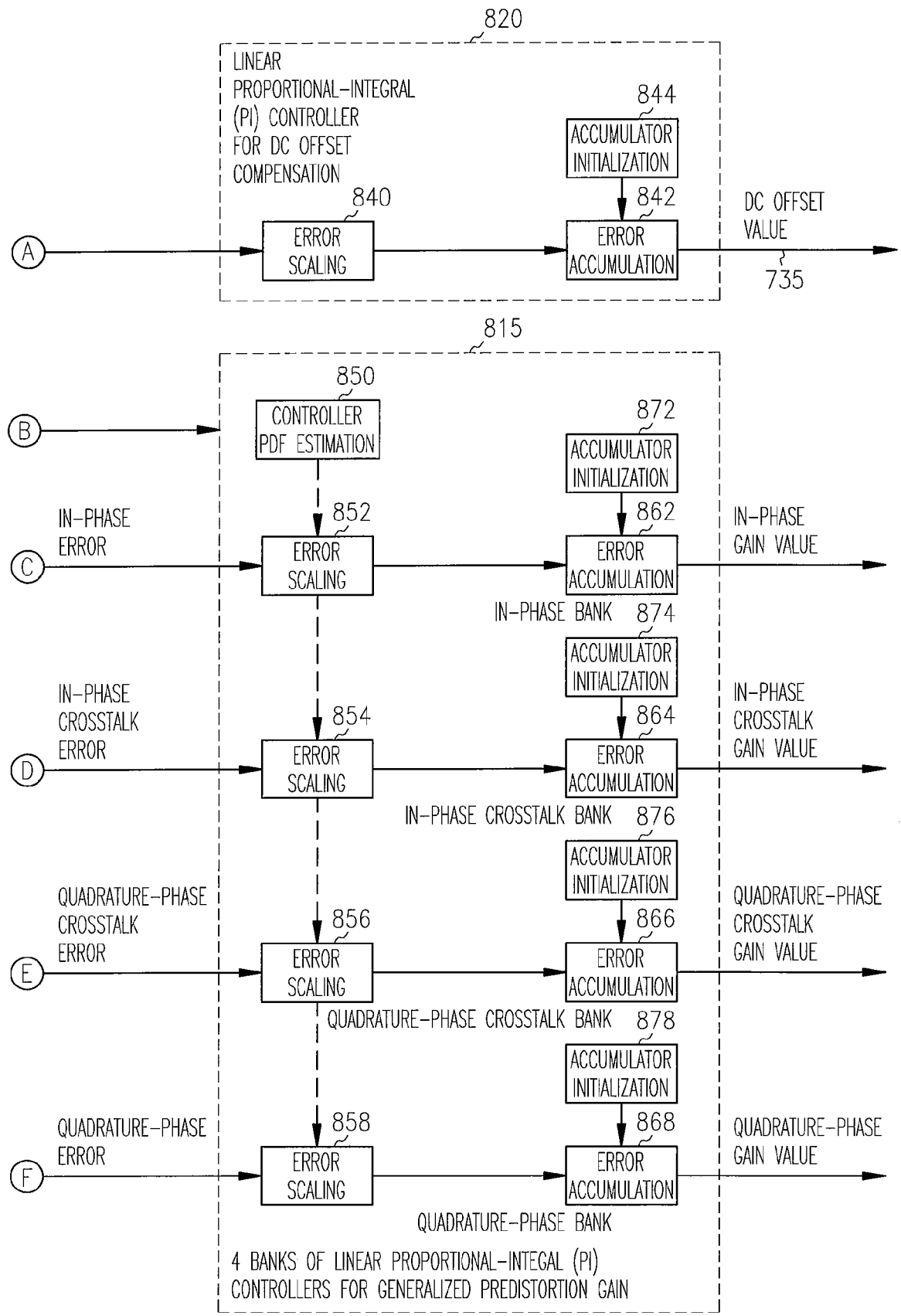

FIGS. 8A and 8B together show a functional diagram of the adaptive controller 725, which employs two inputs and as many outputs as the number of gain elements in the predistortion gain banks plus a separate output 735 for the DC offset compensation adder. Structurally, it is divided in three sections: parametric information conditioner 810, four banks of linear PI controllers 815, and a linear PI controller 820 for DC offset compensation. The functional blocks (FBs) from the first and the third sections operate over the full dynamic range of the input signal. The second section can be viewed as a waffle structure with each layer containing an identical set of functional elements (FEs) necessary to compose a single PI controller from the bank. Identical FEs from different layers, i.e. belonging to different PI controllers from a bank-FB. The layer that processes a particular combination of input samples is chosen by a controller selection FB 822 in the conditioner section 810.

The second section of the controller is described by the structure and relationships among the FEs of a single layer. Prior to reaching the PI controllers 815, the input signal $s_{in}$ at 120 is synchronized with the feedback signal $s_{fb}$ at 106 in a delay FB 824. The delay FB accounts for the finite propagation speed of the input signal through the predistortion gain banks 710, the signal component combiner 723, the DC offset adder, the nonlinear transmitter 110, and the linear receiver 115 until it reaches the adaptive controller 725 as shown in FIG. 7.

Following synchronization, the feedback signal is subtracted from the input signal at 826 to produce a complex error signal which is directly used as an input to the DC offset compensation PI controller 820 and, also, after phase normalization to form four error signals for the gain controller banks 815.

The phase-normalized 'in-phase error signal' is created from the product of the real part of the complex error created by the real error selection FB 832 and the quantized in-phase component of the input signal created by the in-phase signal quantization FB 838. In the simplest and preferred case of 1-bit quantization the second factor has a value of −1 for negative samples and 1 for positive ones.

The phase-normalized 'in-phase crosstalk error signal' is created from the product of the real part of the complex error at 832 and the quantized quadrature-phase component of the input signal created by the quadrature-phase signal quantization FB 834, where 1-bit quantization is preferred too.

The phase-normalized 'quadrature-phase crosstalk error signal' is created from the product of the imaginary part of the complex error created by the imaginary error selection FB 836 and the quantized in-phase component of the input signal at 838.

The phase-normalized 'quadrature-phase error signal' is created from the product of the imaginary part of the complex error at 836 and the quantized quadrature-phase component of the input signal at 834.

The complex error is processed by the DC offset compensation PI controller 820 in two steps: (1) scaling that implements the proportional part of the control function and (2) accumulation that implements the integral part of the control function, performed respectively by the error scaling 840 and error accumulation 842 FBs of this section. The initial state of the error accumulation FB is specified in the accumulator initialization FB 844.

The samples of the four real error signals are distributed to a particular layer of linear PI gain controllers after a choice is made by the controller selection FB 822 from the parametric conditioner section. Each of the samples is propagated to an error scaling FE 852, 854, 856 and 858 and then to an error accumulation FE 862, 864, 866, and 868 realizing respectively the proportional and the integral parts of the control function. The scaling values of the error scaling FEs are multiplied by a factor that is the reciprocal of the probability of their selection. Such normalization of the error scaling is intended to provide same bandwidth of the adaptation processes for all controller layers, meaning that all gain elements from the four predistortion banks (see FIG. 7) have very similar adaptation time constants. The initial states of the error accumulation FEs in all PI controller banks are independently set by their corresponding accumulator initialization FEs 872, 874, 876 and 878. The four PI controller outputs of a particular layer define a 2×2 matrix of real gain values, which determine the generalized predistortion gain applied to the input signal utilizing a matrix of four gain elements from the gain banks shown in FIG. 7.

Model of Nonlinearity and Channel Impairments

An indication for minimal amount of nonlinear distortions caused to a signal by an RF transmitter could be a close match between the input (baseband) signal to this transmitter and a feedback signal, which is a downconverted and sampled version of the signal at its output. (see FIG. 7). Then, the narrowband spectrum of the RF transmitted signal would be very similar to the double-sided baseband spectrum of the input signal provided that the receiver is distortionless. Therefore, the criterion of the optimization of a predistortion gain block inserted before the transmitter, which is carried by an adaptive linearization controller can be defined as:

$$s_{in} \approx s_{fb} \Leftrightarrow s_{in} - s_{fb} \to 0 \qquad 3$$

where $s_{in}$ and $s_{fb}$ are complex number parameters with real and imaginary parts modeling respectively the in- and quadrature-phase components of the input and feedback signals of the linearization system. This criterion is met if the overall gain of the cascaded bank of complex-valued predistortion gain elements composing the predistortion gain block, the nonlinear transmitter and the linear receiver providing an adaptive feedback is unity. If the receiver gain is chosen to be 1 for simplicity of explanation, then, the values of the predistortion gain bank approximate the inverse transmitter gain:

$$G_{pd} \approx (G_{tx})^{-1} \qquad 4$$

where $G_{pd}$ is a continuous function interpolation of the complex values stored in the predistortion bank and $G_{tx}$ is the complex nonlinear transmitter gain.

Such a complex-valued function model of a predistortion gain is accurate only as first-order approximation of the memoryless signal transformations taking place in the adaptive loop. Further sophistication of the model is needed if some hardware impairments of the QAM transmitters are considered such as gain imbalance of the in-phase and quadrature channels or crosstalk interference between them. Effect of such impairments can be modeled using a 2×2 gain matrix $$\overline{G_{imb\_crt}}$$

$$\overline{G_{imb\_crt}} \equiv \begin{bmatrix} G_{imb}^i & G_{crt}^i \\ G_{crt}^q & G_{imb}^q \end{bmatrix}$$

which is applied to modify the in-phase, $\text{Re}[s_{tx}]$, and quadrature-phase, $\text{Im}[s_{tx}]$, components of the transmitted signal at the input of the nonlinear transmitter 110 $s_{tx}$ (see FIG. 7):

$$s_{tx}^{imp} = \text{Re}[s_{tx}^{imp}] + j\text{Im}[s_{tx}^{imp}]$$

$$\begin{bmatrix} \text{Re}[s_{tx}^{imp}] \\ \text{Im}[s_{tx}^{imp}] \end{bmatrix} = \begin{bmatrix} G_{imb}^i & G_{crt}^i \\ G_{crt}^q & G_{imb}^q \end{bmatrix} \begin{bmatrix} \text{Re}[s_{tx}] \\ \text{Im}[s_{tx}] \end{bmatrix}$$

$$s_{tx}^{imp} \triangleq \overline{G_{imb\_crt}} \circ s_{tx}$$

where $G_{imb}^i$, $G_{imb}^q$ are real-valued nonlinear functions of the transmitted signal with values close to 1 that account respectively for the ratio between the measured in- and quadrature-phase channel gains over dynamic range and a given constant reference; $G_{crt}^i$, $G_{crt}^q$ are real-valued nonlinear functions of the transmitted signal with values close to 0 that model the isolation between the in- and quadrature-phase channels by specifying the magnitude and sign of the inter-channel leakage over dynamic range; $s_{tx}^{imp}$ is a complex number parameter modeling a sample of the transmitted signal that is distorted by gain imbalance and crosstalk impairments.

The empty dot symbol '∘' in the Eqs. (5) denotes an operator performing scaling of a complex number $s=a+j·b$ by a matrix of nonlinear functions $\overline{M}$ which is executed in three steps:

constructing a 2×1 matrix from the real and imaginary parts of the signal sample $$s = a + j \cdot b \rightarrow \begin{bmatrix} a \\ b \end{bmatrix}$$

performing a matrix multiplication as shown in the second of Eqs. (5), i.e.

$$\begin{bmatrix} c \\ d \end{bmatrix} = \overline{M} \cdot \begin{bmatrix} a \\ b \end{bmatrix} = \begin{bmatrix} M_{11} & M_{12} \\ M_{21} & M_{22} \end{bmatrix} \cdot \begin{bmatrix} a \\ b \end{bmatrix}$$

The matrix multiplication step involves a sub-step of specifying the values of the four real-numbered functions of the input complex number s which form the elements of the scaling matrix $\overline{M}$:

$$M \equiv M(s) \equiv \begin{bmatrix} M_{11}(s) & M_{12}(s) \\ M_{21}(s) & M_{22}(s) \end{bmatrix}$$

retrieving the real and imaginary parts of the distorted signal sample sd=c+j·d from the 2×1 matrix product obtained in the previous step.

The complex-valued transmitter gain $G_{tx}$ used traditionally to model the transmitter behavior can be equivalently represented in the sense of Eqs. (5) using matrix notation:

$$\overline{G_{tx}} = \begin{bmatrix} \text{Re}[G_{tx}] & -\text{Im}[G_{tx}] \\ \text{Im}[G_{tx}] & \text{Re}[G_{tx}] \end{bmatrix}$$

where each of the four matrix elements is a real-valued nonlinear function of the transmitted signal.

Let the channel impairments originate at the input of the transmitter 110. Then, the signal at the feedback branch 106 is related to the transmitted signal, which is first distorted by the channel impairments and afterwards amplified by the nonlinear transmitter gain. This signal transformation is modeled using two empty dot operators $$s_{fb} = s_{out} = \overline{G_{tx}} \circ (\overline{G_{imb\_crt}} \circ s_{tx}),$$

which can be substituted by a single dot operator with elements including a generalized 2×2 transmit gain matrix $$\overline{G_{tx\_imp}}$$

and the transmitted signal $s_{tx}$:

$$s_{fb} = (\overline{G_{tx}} \otimes \overline{G_{imb\_crt}}) \circ s_{in} = G_{tx\_imp} \circ s_{in}$$

where $$\overline{G_{tx\_imp}}$$

is equal to the nonlinear matrix product '⊗' of $\overline{G_{tx}}$ and $$\overline{G_{imb\_crt}}$$

and is composed of four elements that are real-valued nonlinear functions of $s_{tx}$.

The nonlinear matrix product operator is defined as the product of two matrices $\overline{A}$ and $\overline{B}$ the elements of which are nonlinear functions with related arguments:

$$\overline{A} \otimes \overline{B} = \begin{bmatrix} A_{11}(g(s)) & A_{12}(g(s)) \\ A_{21}(g(s)) & A_{22}(g(s)) \end{bmatrix} \cdot \begin{bmatrix} B_{11}(s) & B_{12}(s) \\ B_{21}(s) & B_{22}(s) \end{bmatrix}, g(s) = \overline{B} \circ s$$

where the argument of the elements of matrix $\overline{A}$ is a complex-valued function, g( ), of the elements of matrix $\overline{B}$ and their argument s. Note, that in the general case the factors of the nonlinear matrix product are not exchangeable, i.e. in the general case $\overline{A} \otimes \overline{B} \neq \overline{B} \otimes \overline{A}$.

The above definition of the generalized transmit gain matrix was derived assuming channel impairments that originate at a single location at the transmitter input. Nevertheless, it can be shown that a similar 2×2 matrix models accurately the effect of multiple points of channel impairments with arbitrary distribution throughout the transmitter chain, i.e. the matrix resulting from the embedded nonlinear matrix products will have four elements that are nonlinear functions of the transmitted signal $s_{tx}$.

Similarly to Eq. (4), linearization of the feedback signal and eventually of the transmitted signal is achieved when the input signal is predistorted using a generalized matrix gain $\overline{G_{pd}}$ specified as a continuous approximation of the inverse of the transmitter gain matrix $$\overline{G_{tx\_imp}}:$$

$$\overline{G_{tx\_imp}} \otimes \overline{G_{pd}} \approx \overline{1} \Leftrightarrow \overline{G_{pd}} \approx [\overline{G_{tx\_imp}}], \overline{1} \equiv \text{unity matrix}$$

The matrix inversion operation is to be regarded in the sense of the above-defined nonlinear matrix product. Note, that the argument of the nonlinear functions forming the elements of the gain matrices is the input signal to the adaptive loop at 120 $s_{in}$ (see FIG. 7).

The sufficient conditions for optimal transmitter linearization from Eq. (7) can be unambiguously fulfilled by processing the feedback signal $s_{fb}$ at 106 if unknown channel impairments are present only in the nonlinear transmitter and, respectively, the linear receiver sections of the adaptive loop 115 contribute only known amounts of channel imbalance and crosstalk.

It has been shown that memoryless transmitter nonlinearity can be modeled with sufficient accuracy using complex functions of the amplitude of the input signal to the adaptive loop $s_{in}|$, i.e. $G_{tx} = G_{tx}(|s_{in}|)$. Extension of the classical memoryless gain-based model to a memoryless generalized gain model of nonlinearity is straightforward when using the matrix notation introduced in the previous paragraph (see Eqs. (5) and (6))—

$$\overline{G_{tx\_imp}} = \overline{G_{tx\_imp}}(|s_{in}|).$$

The generalized transmitter gain matrix $$\overline{G_{tx\_imp}}$$

is regarded here as a matrix of four real-valued nonlinear functions of a real argument. Since the generalized predistortion gain $$\overline{G_{pd}}$$

is an approximation of the inverse of the generalized transmitter gain matrix $$\overline{G_{tx\_imp}}$$

(see Eq. (7)), it is also realized as a function of the input signal magnitude $$|s_{in}|, \overline{G_{pd}} = \overline{Gpd}(|s_{in}|),$$

and its elements are implemented as four banks of real gain elements which are simultaneously addressed depending on the value of $$|s_{in}|.$$

The implementation of accurate continuous approximation of arbitrary functions consumes significant resources in digital hardware. Hence, it is convenient to replace the continuous generalized predistortion gain function $$\overline{G_{pd}}()$$

by a staircase matrix function that is composed of a set of four real staircase functions. The values of the original and its approximation are guaranteed to be the same only for a finite number of discrete values of the argument, which form a 1-dimensional grid. The value of the staircase function for an argument that is off the grid is equal to the function value corresponding to the closest grid mark.

In the currently discussed linearization system, the grid information is contained in the gain selector 719 from FIG. 7 as well as in the controller selection FB 822 from FIG. 8A. Both blocks have the same functionality, which can be summarized as discrimination of the full dynamic range of the input signal in a finite number of magnitude bands. The number of magnitude bands is equal to the number of elements in the gain bank 710 from FIG. 7 and the controller bank 815 from FIG. 8B. If for a given dynamic range the number of bands is sufficiently big, i.e. the step of the grid is sufficiently small, the transmitter behavior can be approximated as linear for the signal samples belonging to one magnitude band. Thus, the sufficient condition from Eq. (7) can be approximated by:

$$\overline{G_{(k)tx\_imp}} \times \overline{G_{(k)pd}} \approx \overline{1} \Leftrightarrow \overline{G_{(k)pd}} \approx [\overline{G_{(k)tx\_imp}}]^{-1}$$

where $\overline{G_{(k)pd}}$ is the generalized gain matrix stored in the k-th set of four elements in the gain banks 712, 714, 716, 718;

$$\overline{G_{(k)tx\_imp}}$$

is the average generalized transmitter gain affecting the samples from the k-th magnitude band; and $$\overline{G_{(k)pd}} = Avg[\overline{Gpd}(|s_{(k)in}|)],$$

$$Avg[\overline{Gpd}(|s_{(k)in}|)] = \overline{Gpd}(\text{Mean}[|s_{(k)in}|])$$

$$|s_{(k)in}| \equiv |s_{in}| \in \text{magitude band } k,$$

$$\text{Mean}[|s_{(k)in}|] \approx \text{magnitude of } k^{th} \text{grid mark}$$

Apparently, the statistical distribution of the input signal magnitude within the band affects the uniformity of the approximation grid. The staircase function approximation is done over a uniform grid only if the mean signal magnitude coincides with the corresponding grid mark for each band. Therefore, in practice where the signal distribution is normally a variable, the generalized predistortion function is non-uniformly approximated.

The task of the adaptive controller is to iteratively find such values for the elements of the gain banks $\overline{G_{(k)pd}}$ so that the mismatch between the sides of Eq. (8) is brought as closely as possible to zero for any k. As long as the transmitter behavior is well-approximated as linear for each magnitude band, a matrix of four banks of linear adaptive controllers (see 815 in FIG. 8B) is suitable to perform a real-time optimization of the above equation.

Model of DC Level Bias in the Transmitter

The effect of DC level bias in the nonlinear transmitter is modeled by adding a complex number $s_{dc}$ of a certain value to the output signal:

$$s_{out} = \overline{G_{tx\_imp}} \cdot s_{tx} + s_{dc}$$

The offset term can be removed by adding another complex number to the transmitted signal $s_{tx}$ at the input of the nonlinear transmitter (see FIG. 7). In the general case, the offset compensation value is not equal to the negated DC level bias, $-s_{dc}$, given that the latter can originate at any and more than one node of the transmitter chain. The magnitude and the sign of compensation for the in- and quadrature-phase channels are determined by trials until the DC components of the input and feedback signals are matched. Considering the linear nature of the DC level bias, the search for optimal compensation values can be performed by a linear adaptive controller.

It is important to note that the DC level bias added to the input signal by the nonlinear transmitter can be effectively removed if any contribution of the linear receiver section to the DC level bias of the feedback signal is known (see FIG. 7). Only then, the DC level bias term in the output signal $s_{dc}$ (see Eq. (9)) can be unambiguously estimated by processing the feedback signal $s_{fb}$.

Algorithm for Memoryless Linearization and Memoryless Channel Impairment Cancellation According to the model of nonlinearity and channel impairments discussed above the problem of memoryless transmitter linearization using a generalized predistortion gain matrix function is formalized by the following expressions (see Eq. (7)):

$$\overline{G_{tx\_imp}} \times \overline{G_{pd}} = 1$$

or equivalently by $$\begin{cases} \text{Re}[s_{in}] = \text{Re}[s_{fb}] \\ \text{Im}[s_{in}] = \text{Im}[s_{fb}] \end{cases}$$

The matrix equation can be re-written as a system of four equations relating the elements of the generalized predistortion and transmitter gain matrices:

$$\begin{cases} G_{pd}^{11} \cdot G_{tx\_imp}^{11} + G_{pd}^{21} \cdot G_{tx\_imp}^{12} = p_{11} = 1 \\ G_{pd}^{12} \cdot G_{tx\_imp}^{11} + G_{pd}^{22} \cdot G_{tx\_imp}^{12} = p_{12} = 0 \\ G_{pd}^{21} \cdot G_{tx\_imp}^{22} + G_{pd}^{11} \cdot G_{tx\_imp}^{21} = p_{21} = 0 \\ G_{pd}^{12} \cdot G_{tx\_imp}^{21} + G_{pd}^{22} \cdot G_{tx\_imp}^{22} = p_{22} = 1 \end{cases}$$

The system of equations describing equality between the input and the feedback signal can also be re-written using the models of generalized predistortion and transmitter gains:

$$\begin{cases} \text{Re}[s_{in}] = (\text{Re}[s_{in}] \cdot G_{pd}^{11} + \text{Im}[s_{in}] \cdot G_{pd}^{12}) \cdot G_{tx\_imp}^{11} + \\ \qquad (\text{Re}[s_{in}] \cdot G_{pd}^{21} + \text{Im}[s_{in}] \cdot G_{pd}^{22}) \cdot G_{tx\_imp}^{12} \\ = \text{Re}[s_{fb}] \\ \text{Im}[s_{in}] = (\text{Re}[s_{in}] \cdot G_{pd}^{21} + \text{Im}[s_{in}] \cdot G_{pd}^{22}) \cdot G_{tx\_imp}^{22} + \\ \qquad (\text{Re}[s_{in}] \cdot G_{pd}^{11} + \text{Im}[s_{in}] \cdot G_{pd}^{12}) \cdot G_{tx\_imp}^{21} \\ = \text{Im}[s_{fb}] \end{cases}$$

The last system of equations is equivalent to (see the p-parameters defined in the previous system of four equations (10))

$$\begin{cases} \text{Re}[s_{in}] = \text{Re}[s_{in}] \cdot p_{11} + \text{Im}[s_{in}] \cdot p_{12} = \text{Re}[s_{fb}] \\ \text{Im}[s_{in}] = \text{Re}[s_{in}] \cdot p_{21} + \text{Im}[s_{in}] \cdot p_{22} = \text{Im}[s_{fb}] \end{cases}$$

The systems of equations (10) and (11) constitute in a formal way the same fact that nonlinear transmitter is linear if $p_{11} = p_{22} = 1$ and $p_{12} = p_{21} = 0$.

A sufficient and necessary condition for fulfillment of Eqs. (11), and respectively of Eqs. (10), can be derived form the system of equations (10) by multiplying both sides of its first and second equations respectively by the in- and quadrature-phase components of the input signal:

$$\begin{cases} p_{11} = 1 \\ p_{12} = 0 \\ p_{21} = 0 \\ p_{22} = 1 \end{cases} \Leftrightarrow \begin{cases} \text{Re}^2[s_{in}] = \text{Re}^2[s_{in}] \cdot p_{11} + \text{Re}[s_{in}] \cdot \text{Im}[s_{in}] \cdot p_{12} \\ \text{Im}[s_{in}] \cdot \text{Re}[s_{in}] = \text{Im}[s_{in}] \cdot \text{Re}[s_{in}] \cdot p_{11} + \text{Im}^2[s_{in}] \cdot p_{12} \\ \text{Re}[s_{in}] \cdot \text{Im}[s_{in}] = \text{Re}^2[s_{in}] \cdot p_{21} + \text{Re}[s_{in}] \cdot \text{Im}[s_{in}] \cdot p_{22} \\ \text{Im}^2[s_{in}] = \text{Im}[s_{in}] \cdot \text{Re}[s_{in}] \cdot p_{21} + \text{Im}^2[s_{in}] \cdot p_{22} \end{cases}$$

which is equivalent to $$\begin{cases} p_{11} = 1 \\ p_{12} = 0 \\ p_{21} = 0 \\ p_{22} = 1 \end{cases} \Leftrightarrow \begin{cases} \text{Re}^2[s_{in}] = \text{Re}[s_{in}] \cdot \text{Re}[s_{fb}] \\ \text{Im}[s_{in}] \cdot \text{Re}[s_{in}] = \text{Im}[s_{in}] \cdot \text{Re}[s_{fb}] \\ \text{Re}[s_{in}] \cdot \text{Im}[s_{in}] = \text{Re}[s_{in}] \cdot \text{Im}[s_{fb}] \\ \text{Im}^2[s_{in}] = \text{Im}[s_{in}] \cdot \text{Im}[s_{fb}] \end{cases}$$

In order to solve the last system of four equations with respect to the predistortion gain components it is sufficient to simultaneously provide cancellation of the four error signals derived from the real and imaginary parts of the difference between the input and the feedback signals:

$$\begin{cases} err_1 \equiv \text{Re}[s_{in}] \cdot (\text{Re}[s_{in}] - \text{Re}[s_{fb}]) = 0 \rightarrow \text{adjust } G_{pd}^{11} \\ err_2 \equiv \text{Im}[s_{in}] \cdot (\text{Re}[s_{in}] - \text{Re}[s_{fb}]) = 0 \rightarrow \text{adjust } G_{pd}^{12} \\ err_3 \equiv \text{Re}[s_{in}] \cdot (\text{Im}[s_{in}] - \text{Im}[s_{fb}]) = 0 \rightarrow \text{adjust } G_{pd}^{21} \\ err_4 \equiv \text{Im}[s_{in}] \cdot (\text{Im}[s_{in}] - \text{Im}[s_{fb}]) = 0 \rightarrow \text{adjust } G_{pd}^{22} \end{cases} \Leftrightarrow p_{11} = 1, p_{12} = 0 \\ \Leftrightarrow p_{21} = 0, p_{22} = 1$$

The real part of this difference is scaled respectively by the in- and quadrature-phase components of the input signal to form the first two equations. Its imaginary part is scaled the same way to form the third and fourth equations respectively.

The system of sufficient conditions for optimal transmitter linearization from Eqs. (10) can be applied without change for the case of staircase function approximation of the optimal generalized predistortion gain function (note the similarity between Eqs. (7) and (8)) just by adding the magnitude band designators '(k)' the signal and gain references. In this case, it is possible to find a numerical solution of the linearized Eqs. (12) if their right-hand sides are processed as error signal inputs to four adaptive controllers of proportional-integral (PI) type (see 815 in FIG. 8B). Note, that the numerical procedure is convergent only if at start-up the overall phase rotation of the predistorted signal $s_{pd}$ at 720 (see FIG. 7) in the nonlinear transmitter and linear receiver is within the interval [−45; 45] deg, i.e. provided that the phase difference between the feedback and the predistorted signals falls in this interval.

The first controller is guided by the first error equation to search for an optimal value of the in-phase predistortion gains $G_{(k)pd}^{11}$, while the second controller is attached to the error signal from the second equation to provide an optimal value of the in-phase crosstalk predistortion gains $G_{(k)pd}^{12}$, and so on for the third and forth controllers delivering the quadrature-phase crosstalk and the quadrature-phase predistortion gains $G_{(k)pd}^{21}$ and $G_{(k)pd}^{11}$ respectively.

The four error signals from Eqs. (12) are created in the parametric conditioner 810 (see FIG. 8A). Quantization of the $\text{Re}[s_{in}]$ and $\text{Im}[s_{in}]$ factors in error definitions (see the left-hand sides of the equations) yields significant reduction of processing complexity needed for the implementation of the four multiplication operations. An appropriate quantization scheme, such as the one resulting in a simple CSD (canonic sign digit) format could replace the arbitrary multiplication with efficient shift-and-add operations. However, the realization of a sign-function (e.g. giving 1 for a positive number and zero, and −1 for a negative number) using 1-bit quantization is an economical solution, which to be implemented requires only a negation and a 2:1 multiplexing operation. The 1-bit quantization scheme shows larger peak-to-peak deviation of the estimated predistortion gains compared to the continuous representation which in most practical cases is small enough not to cause measurable degradation of the over system performance.

Each of the four PI controllers performs magnitude normalization of its error input in order to provide independence from the parameters of the input signal in a sense that all PI controllers have operating bandwidths that are not a function of the magnitude band number k. In fact, their bandwidths become proportional to the average transmitter gain in the magnitude band. In most practical cases the variation of the transmitter gain magnitude over dynamic range, i.e. its nonlinearity, is less than 20%, which allows the PI controllers to have similar bandwidths. Big differences between those bandwidths correspond to largely different adaptation time-constants that may result in twisting of the predistortion values of the gain bank over dynamic range and only partial transmitter linearization when the transmitter nonlinearity changes faster than the slowest running PI controller. This type of normalization is realized in the error scaling FEs 852, 854, 856, 858 (see FIG. 8B) where the error signals are first divided by the mean absolute magnitude of the in- and quadrature-phase components of the input signal for the particular magnitude band. More specifically, the in-phase error and quadrature-phase crosstalk error are divided by the squared mean absolute magnitude of the quadrature-phase component. The quadrature-phase error and in-phase crosstalk error are divided by the mean absolute magnitude of the quadrature-phase component. These normalization factors are constants depending on the supported dynamic range and grid. Importantly, in the case of 1-bit quantization of the in- and quadrature-phase input signal components before multiplication in the parametric conditioner section (see 836 and 838 in FIG. 8A) these factors become reciprocal to the mean of the above absolute values, but not to their squares.

Afterwards, the error signals are scaled again by the probability of selection of this band, that is a continuously estimated parameter (see 850 in FIG. 8B). Depending on the tolerable size of the difference among the bandwidths of the PI controllers (e.g. up to 2 times) the division operation can be implemented with lower precision as a scaling operation using a finite set (e.g. a set of 256 to 1024 values) of CSD constants to approximate the full range of reciprocal probability values. Saturation of the magnitude error normalization may be considered for very small denominator values in order to avoid noise enhancement effects.

After magnitude normalization the complex errors are subjected to further scaling by a real factor μ in the error scaling in the same FEs 852, 854, 856, 858 and then integration in the error accumulation FEs 862, 864, 866, 868 (see FIG. 8B):

$$Y_{m(k)}^n = Y_{m(k)}^{n-1} + \mu_m \cdot err_{m(k)}$$

where $\mu_m$ is the "adaptation step" for the controllers from the m-th bank (m can be 1, 2, 3, or 4 to refer to the in-phase, in-phase crosstalk, quadrature-phase crosstalk, or quadrature-phase controller bank respectively); $Y^n_{m(k)}$ is the output of the k-th controller from the m-th bank at the discrete time instant n; and $err_{m(k)}$ is the magnitude-normalized error corresponding to the k-th band of the m-th (see Eqs. (12)). Typically the four controller banks use one adaptation step μ.

In the perspective of the adaptive loop including the PI controller bank 710 and the nonlinear transmitter 110 (see FIG. 7), the effect of the accumulation is modified to the equivalent of a low-pass filtering operation described by the state-space equation for the forwards terms (1,1) and (2,2) (note that in the equations below the state variable input signal components are neglected assuming perfect magnitude normalization of the error signals):

$$Y_{m(k)}(s) = \frac{inv[G_{(k)tx\_imp}]_{ij}}{1 + \frac{inv[G_{(k)tx\_imp}]_{ij}}{\mu \cdot S_{in\_ph(k)}(s)} \cdot s}, \text{ for } ij \in \{11, 22\}, m = i + j - 1$$

and for the cross terms (1,2) and (2,1) by:

$$Y_{m(k)}(s) = \frac{inv[G_{(k)tx\_imp}]_{ij}}{1 + \frac{1}{\mu \cdot S_{in\_ph(k)}(s)} \cdot s}, \text{ for } ij \in \{12, 21\}$$

where $Y_{m(k)}(s)$ is the state-space output of the k-th controller that specifies the predistortion gain of the m-th bank for the k-th magnitude band, $G_{(k)pd_{ij}} = Y_{m(k)}(s)$; and inv[ ] denotes a matrix inversion operator. The signal parameter $s_{in\_ph(k)}(s)$, which is set to one, represents the state-space image of the normalized modulus of the in-phase input signal component $|Re[s_{in(k)}]|$ for $ij\in\{11,12\}$ or of the quadrature-phase input signal component $|Im[s_{in(k)}]|$ for $ij\in\{22,21\}$. In the case of partial error normalization including only the probability of controller selection, it becomes a non-negligible parameter accounting for the squared input signal components or their moduli if 1-bit quantization is performed during formation of the error signals in the parametric conditioner section (see FIG. 7). The operating bandwidths of the in- and quadrature-phase PI controllers are proportional to $\mu/|inv[G_{(k)tx\_imp}]_{11}| \approx \mu$ and $\mu/|inv[G_{(k)tx\_imp}]_{22}| \approx \mu$, respectively, provided that the forward elements (1,1) and (2,2) of the generalized transmitter gain matrix are not far from unity. Similarly, the operating bandwidths of the crosstalk PI controllers are proportional to $\mu$ independently from the cross elements (1,2) and (2,1) of the generalized transmitter gain matrix.

Conclusively, within its operating bandwidth the predistortion gain $G_{(k)pd_{ij}}$ exercised by the attached to it predistortion gain bank (see FIG. 7) is approximately equal to its corresponding element of the generalized transmitter gain matrix inverse $inv[G_{(k)tx\_imp}]_{ij}$ for a given magnitude band as required in Eq. (8).

Algorithm for DC Level Bias Compensation

Extraction of the DC components of the feedback signal $s_{dc}$ (see Eq. (9)) can be done by simple integration using an integrator accumulator with slope factor $\mu_{dc}$:

$$s_{dc}^e = \frac{s_{fb}}{\frac{s}{\mu_{dc}}} \sim \mu_{dc} \cdot s_{dc}$$

where s is Laplace's state-space variable. The idea behind the integration is to amplify infinitely the DC signal content at a rate proportional to $\mu_{dc}$ while suppressing infinitely its high-frequency components. If the DC content of the input signal is extracted the same way, then the difference between the two DC levels constitutes a good initial guess for searching for the optimal value of DC offset compensation that takes place after the predistortion bank (see FIG. 7):

$$DC_{comp}(s) = \frac{(s_{in} - s_{fb})}{\frac{s}{\mu_{dc}}}$$

The above equation describes the update rule of the linear PI controller for DC offset compensation 820 from FIG. 8B where $DC_{comp}$ is its output signal in Laplace's state-space format and $\mu_{dc}$ defines the magnitude of scaling in its error scaling FB. The update rate of the offset compensation values (the rate of iterative search for their optimum) is proportional to $\mu_{dc}$.

The goal of the PI controller is to zero the difference signal $s_{in} - s_{fb}$ over time using the adaptive loop. Accordingly, the state-space equation of the input signal to the error accumulation FB modified by the loop is $DC_{err}$, where $$DC_{err}(s) = \overline{G_{tx\_imp}} \cdot (s_{in} - s_{fb}) \cdot \mu_{dc} \cdot \frac{s}{1 + \frac{s}{\mu_{dc}}}$$

The time-domain equivalent of the last equation is a decay exponential function, which models the return-to-zero-state trajectory of a PI closed loop. The bandwidth of the suggested DC offset compensation algorithm is proportional to $\mu_{dc}$ and is invariant with respect to the input signals to the controller. This is a logical result stemming from the fact that this compensation algorithm is realized in a classical control system but not in an adaptive one. In other words, the optimization goal is achieved using an appropriately sized signal inverse of the targeted impairment that is combined with the input signal to the system instead of modifying the parameters of certain functional system blocks to cancel it.

The adaptation step of the DC offset compensation controller $\mu_{dc}$ should be larger than the corresponding steps of the predistortion PI controllers 815 (see FIG. 8B) $\mu_m$ in order to allow faster compensation of bias variations of the predistorted signal that would otherwise require respective re-alignment of the predistortion gain banks and eventually might downgrade the linearization performance.

It is important to note that the described DC offset compensation algorithm is unconditionally convergent only if the average phase rotation of the input signal $s_{in}$ (see FIG. 7) in the predistortion banks, nonlinear transmitter and linear receiver is within the interval [−45; 45] deg, i.e. provided that the phase difference between the feedback signal at 106 and the input signal at 120 falls in this interval. This condition is satisfied after initial convergence of the predistortion PI controller banks and is always maintained during their normal operation.

CONCLUSION

A summary of some of the main features of the proposed adaptive controller for linearization of a transmitter with system impairments, which may be provided by some of the embodiments, is listed below:

(a) distinction between the nonlinear and the linear transmitter impairments leading to efficient cancellation of the latter;

(b) extraction of the nonlinear component of the transmitter gain and its inverse in terms of a normalized predistortion gain (of zero mean phase and unity average magnitude) allowing separate management of the linearization process from the transmitter (bulk) power gain and average phase rotation;

(c) generality of the solution including independence from the signaling format, the adaptation algorithms and the adopted model of transmitter nonlinearity as well as no involvement of test sequences or configurations;

(d) simple real-time system management using time division multiplexing of functional blocks where the drawback is an increase of the settling-time of the linearization process that can be tolerated in most practical cases;

(e) simplified system design due to lower noise requirements;

(f) basis for simplified linearization process and, respectively, algorithms due to signal normalization.

Some of the embodiments of the proposed adaptive controller for linearization of a transmitter with multi-channel impairments may demonstrate the following characteristics:

(g) continuous estimation of the values of a matrix of $n^2$ banks of real gain elements (called predistortion gain banks) that are cascaded with the linearized transmitter and provide approximation of the inverse generalized transmitter gain matrix, where the latter is defined as a n×n matrix with n equal to the number of independently transmitted phases of the input signal (for a QAM transmitter n=2) and is intended to model the overall nonlinear transmitter gain, the gain imbalance of the phase channels as well as the crosstalk among them;

(h) output distortion cancellation achieved using real-time optimization of the gains of the predistortion banks cascaded with the transmitter gain matrix in order to minimize the time-domain error measuring the difference between the input and output signals of this predistortion cascade, where the optimization data is processed in the format of the input signals to the transmitter and is not subjected to coordinate transformations;

(i) efficient and (noise) unbiased adaptation of the predistorter gain banks to their optimal states realized by $n^2$ banks of linear adaptive controllers of proportional-integral (PI) type, where the adaptation process is convergent if the initial phase of the time-domain adaptive error falls in the interval [−45; 45] deg;

(j) efficient generation of phase normalized error signal inputs to the $n^2$ PI controllers implemented using the products of the single-bit sign of the input signal phases and the time-domain adaptive error;

(k) independent operation of each of the linear PI controllers within a narrow dynamic range of the input signal and has a time-constant with significantly lower sensitivity to changes of its power and statistics;

(l) efficient and (noise) unbiased cancellation of DC level bias in the transmitter obtained using a single linear PI controller combining the appropriately accumulated time-domain adaptive error with the predistorted by the gain banks input signal to the predistortion cascade.

Both conceptual controller architectures targeting system and multi-channel impairments allow:

(m) efficient implementation in real-time digital hardware since only conventional storage, addition, scaling and multiplication operations are required for their physical realization.

What is claimed is:

1. A controller for multi-channel transmitter linearization, comprising:
    a bank of predistortion gain elements cascaded with the transmitter for modeling nonlinear transmitter gain, gain imbalance of channels, and crosstalk between the channels; and
    a bank of adaptive controllers optimizing the gains of the bank of predistortion gain elements based on an input signal to be transmitted, without coordinate transformation; wherein the adaptive controllers comprise a Proportional-Integral (PI) controller and wherein an initial phase of a time-domain adaptive error falls in an interval between approximately −45 and +45 degrees to ensure convergence.

2. The controller of claim 1 wherein the bank of predistortion gain elements comprises n*2 real gain elements, where n is equal to the number of simultaneously transmitted components of the input signal that is the same as the number of channels in the transmitter.

3. The controller of claim 2 wherein n=2.

4. The controller of claim 1 wherein each of the adaptive controllers operates independently over a narrow dynamic range of the input signal.

5. The controller of claim 1 wherein each adaptive controller has a time constant with low sensitivity to changes of its power and statistics.

6. The controller of claim 1 wherein the adaptive controllers utilize the products of the single-bit sign of the input signal phases and the time-domain adaptive error.

7. A controller for multi-channel transmitter linearization, comprising:
    a bank of predistortion gain elements cascaded with the transmitter for modeling nonlinear transmitter gain, gain imbalance of channels, and crosstalk between the channels; and
    a bank of adaptive controllers optimizing the gains of the bank of predistortion gain elements based on an input signal to be transmitted, without coordinate transformation, wherein an adaptive controller cancels DC level bias in the transmitter by adding an accumulated time-domain adaptive error by a proportional-integral controller to the predistorted input signal by the gain bank in a DC-level signal combiner located after the predistortion gain bank and before the transmitter.

8. A controller for memoryless gain based baseband linearization of a multi-channel signal transmitter, comprising:
    a bank of predistortion gain elements cascaded with the transmitter for modeling overall nonlinear transmitter gain while minimizing channel effects; and
    an adaptive controller composed of a bank of proportional-integral controllers optimizing the gains of the bank of predistortion gain elements based on an input signal to be transmitted; wherein the adaptive controller comprises a Proportional-Integral (PI) controller and wherein an initial phase of a time-domain adaptive error falls in an interval between approximately −45 and +45 degrees to ensure convergence.

9. The controller of claim 8 wherein channel effects comprise gain imbalance of the transmitter channels and crosstalk between them.

10. A controller for multi-channel transmitter linearization, comprising:
    four banks of gain elements;
    a gain elements selector coupled to an input signal;
    an in-phase signal selector coupled to the input signal;
    a quadrature-phase signal selector coupled to the input signal;
    an adaptive controller coupled to the input signal and to a feedback signal from the transmitter, wherein the adaptive controller provides gain control to the banks of gain elements, and a parametric DC offset control to the transmitter.

11. The controller of claim 10 wherein the in-phase signal selector is coupled to the gain elements of a bank of in-phase gain elements and a bank of quadrature-phase crosstalk elements.

12. The controller of claim 11 wherein the quadrature-phase signal selector is coupled to the gain elements of a bank of quadrature-phase gain elements and a bank of in-phase crosstalk elements.

13. The controller of claim 12 and further comprising a signal component combiner coupled to the outputs of each gain element in the banks of gain elements.

14. The controller of claim 13 wherein the signal component combiner combines signals from a selected set of four gain elements each from one of the four banks of gain elements that account for channel gain and crosstalk correction.

15. The controller of claim 14 and further comprising an adder for combining a predistorted input signal from the signal component combiner and the DC offset from the adaptive controller.

16. An adaptive controller for banks of gain elements for multi-channel transmitter linearization, the controller comprising:
   a parametric information conditioner coupled to an input signal and a feedback signal from the transmitter;
   multiple banks of linear proportional-integral controllers coupled to the conditioner and providing gain values for the banks of gain elements; and
   a proportional-integral DC offset compensation controller coupled to the conditioner.

17. The adaptive controller of claim 16 wherein the parametric information conditioner comprises:
   a delay element coupled to the input signal
   an error formation block coupled to the delay element and the feedback signal
   a controller selector coupled to the delay element;
   an in-phase signal quantizer coupled to the delay element;
   a real error selector;
   an imaginary error selector; and
   a quadrature-phase signal quantizer coupled to the delay element.

18. The adaptive controller of claim 17 wherein the parametric information conditioner provides:
   a complex-valued error derived by subtracting the feedback signal from the delayed input signal in the error formation block;
   an in-phase error signal derived as a product of the real error and the quantized in-phase signal created respectively by the real error selector and the in-phase signal quantizer;
   an in-phase crosstalk error signal derived as a product of the real error and the quantized quadrature-phase signal created respectively by the real error selector and the quadrature-phase signal quantizer;
   quadrature-phase crosstalk error signal derived as a product of the imaginary error and the quantized in-phase signal created respectively by the imaginary error selector and the in-phase signal quantizer; and
   quadrature-phase error signal derived as a product of the imaginary error and the quantized quadrature-phase signal created respectively by the imaginary error selector and the quadrature-phase signal quantizer.

19. The adaptive controller of claim 18 wherein the parametric information conditioner provides in-phase error, in-phase crosstalk error, quadrature-phase crosstalk error and quadrature-phase error signals to four corresponding banks of linear proportional-integral controllers.

20. The adaptive controller of claim 18 wherein the parametric information conditioner comprises one-bit in-phase and quadrature-phase quantizers that provide at their outputs one value of positive or negative sign that corresponds unambiguously to the sign of signals at their inputs.

21. The adaptive controller of claim 16 wherein each of the banks of linear proportional-integral controllers comprises multiple error scaling blocks coupled to error accumulation blocks.

22. The adaptive controller of claim 21 wherein the banks of linear proportional-integral controllers provide in-phase, in-phase crosstalk, quadrature-phase crosstalk and quadrature-phase gain values.

23. The adaptive controller of claim 17 wherein the delay element provides a delay to account for finite propagation speeds of the input signal.

* * * * *

UNITED STATES PATENT AND TRADEMARK OFFICE
CERTIFICATE OF CORRECTION

PATENT NO. : 7,558,332 B2
APPLICATION NO. : 11/956252
DATED : July 7, 2009
INVENTOR(S) : Peter Z. Rashev et al.

It is certified that error appears in the above-identified patent and that said Letters Patent is hereby corrected as shown below:

In column 4, line 36, delete "inand" and insert -- in- and --, therefor.

In column 8, line 17, delete "135 i is" and insert -- 135 is --, therefor.

In column 8, line 47, after " $G_L = \text{Mean}[G_{tx}] \cdot G_{rx} \cdot G_{imp}$ " insert -- 2 --.

In column 13, line 21, after " $\begin{bmatrix} \text{Re}[s_{tx}^{imp}] \\ \text{Im}[s_{tx}^{imp}] \end{bmatrix} = \begin{bmatrix} G_{imb}^i & G_{crt}^i \\ G_{crt}^q & G_{imb}^q \end{bmatrix} \begin{bmatrix} \text{Re}[s_{tx}] \\ \text{Im}[s_{tx}] \end{bmatrix}$ " insert -- 5 --.

In column 14, line 2, delete "sd=c" and insert -- $s_d$=c --, therefor.

In column 14, line 24, after " $s_{fb} = s_{out} = \overline{G_{tx}} \circ (\overline{G_{imb\_crt}} \circ s_{tx})$ " insert -- 6 --.

In column 15, line 25, delete

" $\overline{G_{tx\_imp}} \otimes \overline{G_{pd}} \approx \overline{1} \Leftrightarrow \overline{G_{pd}} \approx [\overline{G_{tx\_imp}}], \overline{1} \equiv \text{unity matrix}$ " and insert -- $\overline{G_{tx\_imp}} \otimes \overline{G_{pd}} \approx \overline{1} \Leftrightarrow \overline{G_{pd}} \approx [\overline{G_{tx\_imp}}] \overline{G_{(k)tx\_imp}} \times \overline{G_{(k)pd}} \approx \overline{1} \Leftrightarrow \overline{G_{(k)pd}} \approx [\overline{G_{(k)tx\_imp}}]^{-1}$ --, therefor.

In column 15, line 25, after "unity matrix" insert -- 7 --.

In column 15, line 42, delete "$s_{in}$]," and insert -- [$s_{in}$], --, therefor.

In column 16, line 45, after " $\overline{G_{(k)tx\_imp}} \times \overline{G_{(k)pd}} \approx \overline{1} \Leftrightarrow \overline{G_{(k)pd}} \approx [\overline{G_{(k)tx\_imp}}]^{-1}$ " insert -- 8 --.

In column 16, line 61, delete "magitude" and insert -- magnitude --, therefor.

In column 17, line 24, after " $s_{out} = \overline{G_{tx\_imp}} * s_{tx} + s_{dc}$ " insert -- 9 --.

In column 18, line 10, after " $\begin{cases} G_{pd}^{11} \cdot G_{tx\_imp}^{11} + G_{pd}^{21} \cdot G_{tx\_imp}^{12} = P11 = 1 \\ G_{pd}^{12} \cdot G_{tx\_imp}^{11} + G_{pd}^{22} \cdot G_{tx\_imp}^{12} = P12 = 0 \\ G_{pd}^{21} \cdot G_{tx\_imp}^{22} + G_{pd}^{11} \cdot G_{tx\_imp}^{21} = P21 = 0 \\ G_{pd}^{12} \cdot G_{tx\_imp}^{21} + G_{pd}^{22} \cdot G_{tx\_imp}^{22} = P22 = 1 \end{cases}$ " insert -- 10 --.

UNITED STATES PATENT AND TRADEMARK OFFICE
CERTIFICATE OF CORRECTION

PATENT NO. : 7,558,332 B2
APPLICATION NO. : 11/956252
DATED : July 7, 2009
INVENTOR(S) : Peter Z. Rashev et al.

It is certified that error appears in the above-identified patent and that said Letters Patent is hereby corrected as shown below:

In column 18, line 34, after "$\begin{cases} Re[s_{in}] = Re[s_{in}]p11 + Im[s_{in}]p12 = Re[s_{fb}] \\ Im[s_{in}] = Re[s_{in}]p21 + Im[s_{in}]p22 = Im[s_{fb}] \end{cases}$" insert -- 11 --.

In column 19, line 8, after "$\begin{cases} err_1 = Re[s_{in}](Re[s_{in}] - Re[s_{fb}]) = 0 \rightarrow adjust\ G_{pd}^{11} \\ err_2 = Im[s_{in}](Re[s_{in}] - Re[s_{fb}]) = 0 \rightarrow adjust\ G_{pd}^{12} \\ err_3 = Re[s_{in}](Im[s_{in}] - Im[s_{fb}]) = 0 \rightarrow adjust\ G_{pd}^{21} \\ err_4 = Im[s_{in}](Im[s_{in}] - Im[s_{fb}]) = 0 \rightarrow adjust\ G_{pd}^{22} \end{cases} \Leftrightarrow \begin{matrix} p11=1, p12=0 \\ p21=0, p22=1 \end{matrix}$" insert -- 12 --.

Signed and Sealed this

Thirteenth Day of October, 2009

David J. Kappos
*Director of the United States Patent and Trademark Office*